US007502589B2

(12) United States Patent
Howard et al.

(10) Patent No.: US 7,502,589 B2
(45) Date of Patent: Mar. 10, 2009

(54) SUPPLEMENTAL BROADCAST DATA PROCESSING

(75) Inventors: Damian Howard, South Boston, MA (US); Kenneth S. Yoshioka, Sutton, MA (US)

(73) Assignee: Bose Corporation, Framingham, MA (US)

( * ) Notice: Subject to any disclaimer, the term of this patent is extended or adjusted under 35 U.S.C. 154(b) by 284 days.

(21) Appl. No.: 10/313,213

(22) Filed: Dec. 6, 2002

(65) Prior Publication Data

US 2004/0110522 A1 Jun. 10, 2004

(51) Int. Cl.
*H04H 40/00* (2008.01)

(52) U.S. Cl. .......................... 455/3.06; 725/53

(58) Field of Classification Search ................. 455/512, 455/566, 154.1, 154.2, 161.1, 161.2, 161.3, 455/197.3, 198.1, 226.2, 226.3, 226.4, 186.1, 455/186.2, 3.01, 179.1, 184.1, 185.1, 3.06; 370/496, 77, 27; 704/500; 725/34, 38, 53, 725/56, 57

See application file for complete search history.

(56) References Cited

U.S. PATENT DOCUMENTS

| 4,987,605 | A | | 1/1991 | Nose |
| 5,063,610 | A | | 11/1991 | Alwadish |
| 5,390,343 | A | * | 2/1995 | Rupprecht et al. ....... 455/161.3 |
| 5,393,713 | A | | 2/1995 | Schwob |
| 5,475,874 | A | | 12/1995 | Klos |
| 5,515,372 | A | * | 5/1996 | Porter ........................ 370/312 |
| 5,548,828 | A | | 8/1996 | Kozaki et al. |
| 5,584,051 | A | * | 12/1996 | Goken ......................... 455/68 |
| 5,628,061 | A | | 5/1997 | Shirakawa |
| 5,802,066 | A | | 9/1998 | Miyake et al. |
| 5,898,910 | A | | 4/1999 | Miyake et al. |
| 6,021,320 | A | | 2/2000 | Bickford et al. |
| 6,161,002 | A | | 12/2000 | Migliaccio et al. |
| 6,240,280 | B1 | | 5/2001 | Ravi et al. |
| 6,411,800 | B1 | | 6/2002 | Emerson, III |
| 6,470,178 | B1 | | 10/2002 | Cummings-Hill et al. |
| 6,473,792 | B1 | * | 10/2002 | Yavitz et al. ................. 709/217 |
| 6,751,401 | B1 | | 6/2004 | Arai et al. |
| 6,978,471 | B1 | * | 12/2005 | Klopfenstein ................. 725/50 |
| 2002/0184038 | A1 | * | 12/2002 | Costello et al. ............. 704/500 |
| 2003/0050024 | A1 | * | 3/2003 | Fukushima .............. 455/161.2 |

(Continued)

FOREIGN PATENT DOCUMENTS

CN A3 1251700 4/2000

(Continued)

OTHER PUBLICATIONS

EP Search REport in Appl. No. 06116547.8, dated Oct. 26, 2007.

(Continued)

*Primary Examiner*—Tu X Nguyen
(74) *Attorney, Agent, or Firm*—Fish & Richardson P.C.

(57) ABSTRACT

Scan a plurality of broadcast signals, select and receive one of the scanned broadcast signals and determine parameters about the received broadcast signal. Assign a priority to the received broadcast signal based on the parameters, and store the parameters and priority in memory. Redetermine the parameters in priority order in a manner that reduces the time for redetermining. Reassign a priority to the received broadcast signal based on the redetermined parameters, and update in memory the redetermined parameters and priority.

24 Claims, 18 Drawing Sheets

U.S. PATENT DOCUMENTS

| | | |
|---|---|---|
| 2003/0093790 A1* | 5/2003 | Logan et al. .................. 725/38 |
| 2003/0186661 A1* | 10/2003 | Fricke et al. ............. 455/150.1 |
| 2004/0025192 A1* | 2/2004 | Angel et al. ................ 725/139 |
| 2004/0110522 A1 | 6/2004 | Howard et al. |
| 2004/0168121 A1* | 8/2004 | Matz .......................... 715/513 |
| 2006/0067260 A1 | 3/2006 | Tokkonen et al. |
| 2008/0022296 A1* | 1/2008 | Iggulden ..................... 725/22 |

FOREIGN PATENT DOCUMENTS

| | | |
|---|---|---|
| DE | 198 30 608 A1 | 1/2000 |
| EP | 0 584 839 A1 | 3/1994 |
| EP | 1 434 371 | 6/2004 |
| EP | 1 447 928 | 8/2004 |
| EP | 1 139 574 | 10/2004 |
| WO | A4 WO 98/44645 | 10/1998 |
| WO | WO 02/03583 A2 | 1/2002 |

OTHER PUBLICATIONS

Office Action issued in Chinese Application Serial No. 200310116434.X, dated Feb. 15, 2008.

* cited by examiner

FIG. 3

| | Tuned Freq (302) | PI match (304) | RF (306) | RDS (308) | TP (310) | TA (312) | TP Mode On (314) | AF (316) | RT found (318) | RT useful (320) | TMC possible (322) | PRIORITY assigned (324) |
|---|---|---|---|---|---|---|---|---|---|---|---|---|
| Test 1: Basic judgment based on RF and RDS | | | | | | | | | | | | |
| 326 | X | X | 0 | 0 | | | | | | | | D |
| 328 | X | X | OR | | | | | | | | | C |
| Test 2: TMC | | | | | | | | | | | | |
| 330 | X | X | X | X | X | X | X | X | X | X | 1 | B |
| Test 3: Radio text | | | | | | | | | | | | |
| 332 | X | X | OR | | X | X | X | X | 1 | 00 | X | B |
| 334 | X | X | OR | | X | X | X | X | 1 | 01 | X | B |
| 336 | X | X | OR | | X | X | X | X | 1 | 10 | X | C |
| 338 | X | X | OR | | X | X | X | X | X | 11 | X | B |
| Test 4: AF list of foreground broadcast signal | | | | | | | | | | | | |
| 340 | X | X | X | X | X | X | X | 1 | X | X | X | B |
| Test 5: TP/TA (when TP_mode is selected) | | | | | | | | | | | | |
| 342 | 0 | X | OR | | 0 | 1 | 1 | X | X | X | X | B |
| 344 | 0 | X | OR | | 1 | 0 | 1 | X | X | X | X | B |
| 346 | 0 | X | OR | | 1 | 1 | 1 | X | X | X | X | A |
| Test 6: PI match | | | | | | | | | | | | |
| 348 | 0 | 1 | 0 | 0 | X | X | X | X | X | X | X | B |
| 350 | 0 | 1 | OR | | X | X | X | X | X | X | X | A |
| Test 7: Foreground tuned broadcast signal | | | | | | | | | | | | |
| 352 | 1 | X | X | X | X | X | X | X | X | X | X | A |

* RECORDING TO FOLDER 'ENTERED' BY USER OR TO A PREDETERMINED FOLDER NAMED 'RADIO' etc. STORES 'SONG', 'ARTIST', 'GENRE' AND 'TIME'

SUPPLEMENTAL BROADCAST DATA PROCESSING

BACKGROUND OF THE INVENTION

This invention relates to systems and methods for receiving and processing broadcast data, and more specifically to systems and methods for receiving and processing supplemental data associated with broadcast radio programs.

Many broadcast systems are capable of transmitting supplemental data associated with conventional radio broadcasts which may provide a receiving system with additional information about a received broadcast or about other receivable broadcasts. Examples of such systems are the Radio Data System (RDS) in Europe and the related Radio Broadcast Data System (RBDS) in North America. Such supplemental data may include information such as: a program identifier describing the program being broadcast (PI), which may also be used to identify the geographical availability of the program; the program service name (PS, typically the call letters of a broadcast station); the genre or program type (PTY); a list of alternate frequencies (AF); whether traffic condition announcements are being broadcast at a given time (TA) or are generally available on a frequency (TP, or traffic program); the time of day (CT, or clock time); a free text area left to the discretion of the transmitter (RT, or radio text); traffic data which permits a display of traffic conditions (TMC, or traffic message channel); information about other stations (EON, or enhanced other networks information); information about the country of origin of the transmission (ECC, or extended country code), the program item number (PIN), permitting the unique identification of a specific program by its PI and PIN; and data about the content and encoding of an audio signal, such as whether music or speech is being broadcast (MS), or data permitting the receiving system to switch individual decoders on or off, or to indicate whether the PTY code is dynamic (DI, or decoder identification).

However, both current systems and methods and the supplemental information provided are limited. For example, the seeking and selection of alternate frequencies or stations broadcasting supplemental traffic information such as TMC data, for example, may result in an interruption in station reception. Furthermore, the possibility exists that the alternative broadcast selected may not be the optimum choice available. In addition, information about other broadcast stations is left to the discretion of the transmitter, and does not provide complete information about other receivable broadcasts. It would therefore be desirable to have systems and methods which would better permit the reception and processing of supplemental broadcast data.

SUMMARY OF THE INVENTION

According to the invention, select and receive a broadcast signal. Determine parameters about the broadcast signal and assign a priority based on the determined parameters. Store the parameters and priority. Redetermine the parameters in priority order in a manner that reduces the time for redetermining. Reassign a priority to the received broadcast signals based on the redetermined parameters, and update in memory the redetermined parameters and priority.

BRIEF DESCRIPTION OF THE SEVERAL VIEWS OF THE DRAWING

FIG. 3 shows a table of tests that may be performed to determine the priority to be assigned to a broadcast signal;

DETAILED DESCRIPTION

The figures and descriptions thereof depict a preferred embodiment of the present invention for illustration purposes only. It will be readily apparent to one of ordinary skill in the art that alternative embodiments of the systems and methods described herein may be employed without departing from the principles described herein.

The systems and methods of the present invention permit the reception and processing of multiple broadcast signals comprising program data and supplemental data associated therewith. A broadcast signal may include signals such as AM, FM, VHF or UHF transmissions, a satellite broadcast signal such as XM radio, HD Radio (also known as digital radio or IBOC, created by Ibiquity, Inc.) or other known radio frequency or wireless broadcast signal types. Broadcast signals may also include streaming audio over a network, which for example could be provided by an Internet music server or Internet Radio. Broadcast signals may be in analog or digital form. Broadcast signals may also include program and supplemental data that has been encoded and modulated in accordance with the United States RDBS Standard dated Apr. 9, 1998. Program and supplemental data may be analog or digital, or may be an analog signal modulated by a digital bit stream in some manner. Supplemental data may be RDS data or any other accompanying data transmitted in any protocol or format.

Figure 1A:
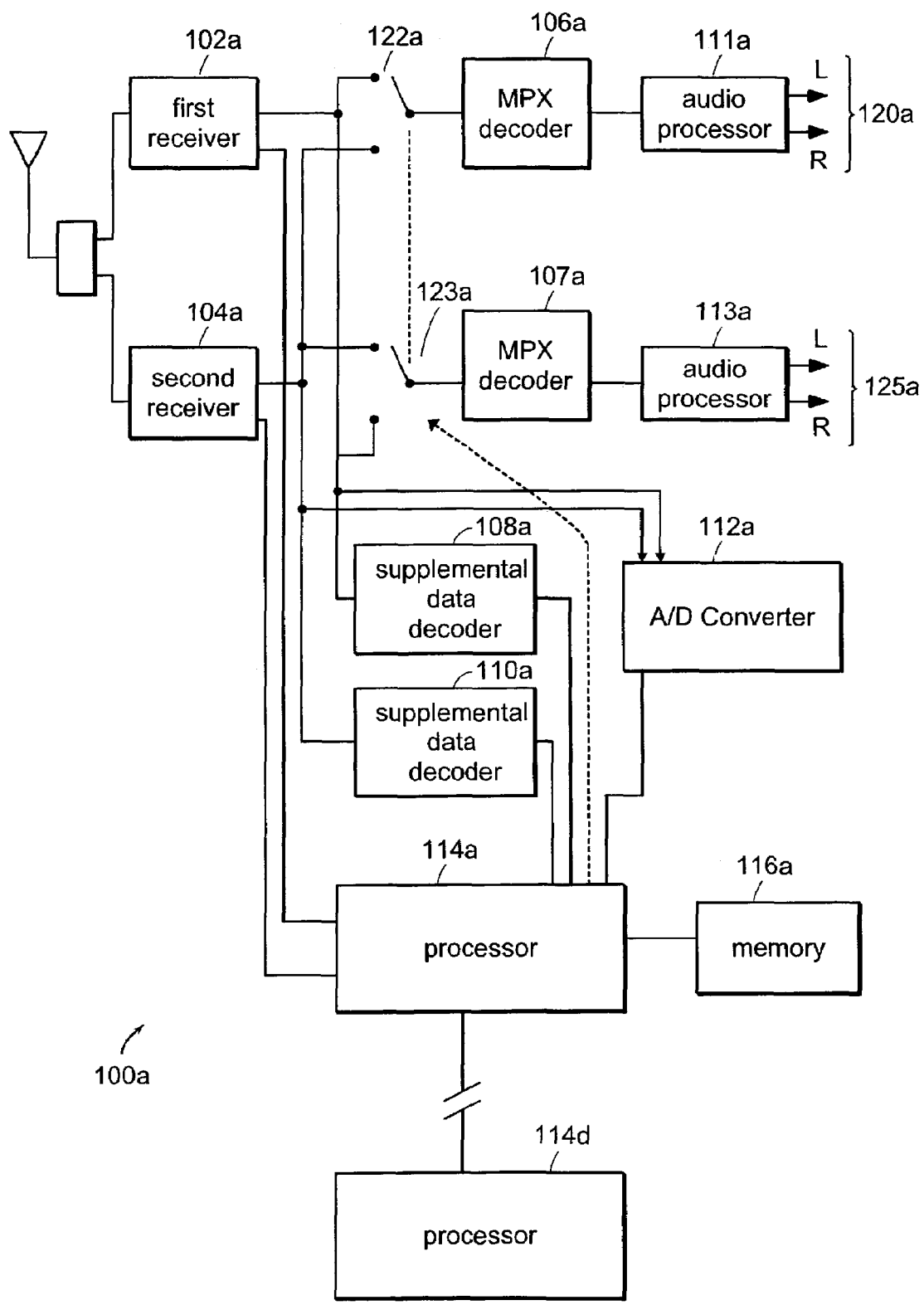
FIGS. 1a, 1b, 1c and 1d show simplified diagrams of systems capable of receiving broadcast signals in accordance with embodiments of the present invention.
Figure 1B:
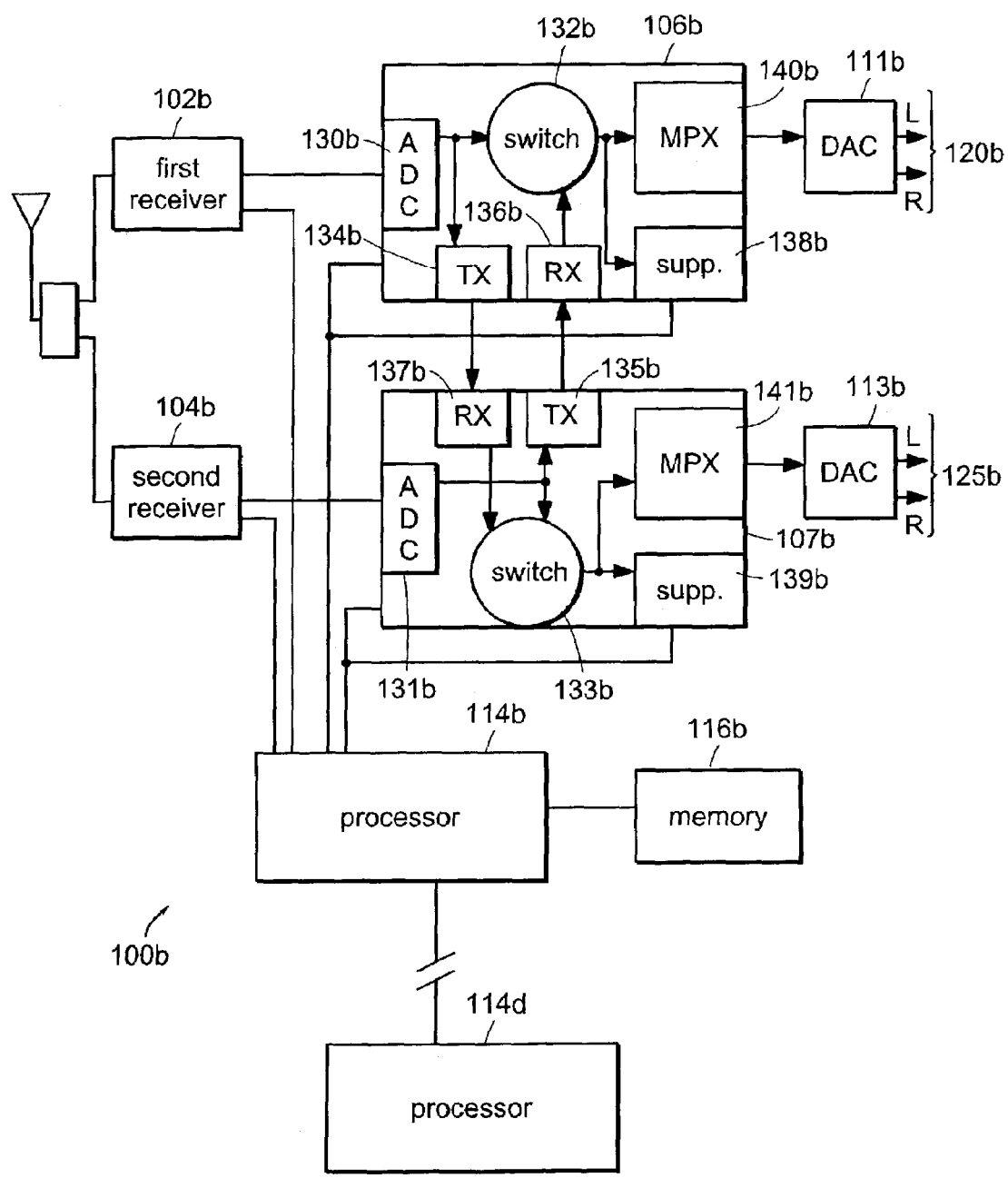
Figure 1C:
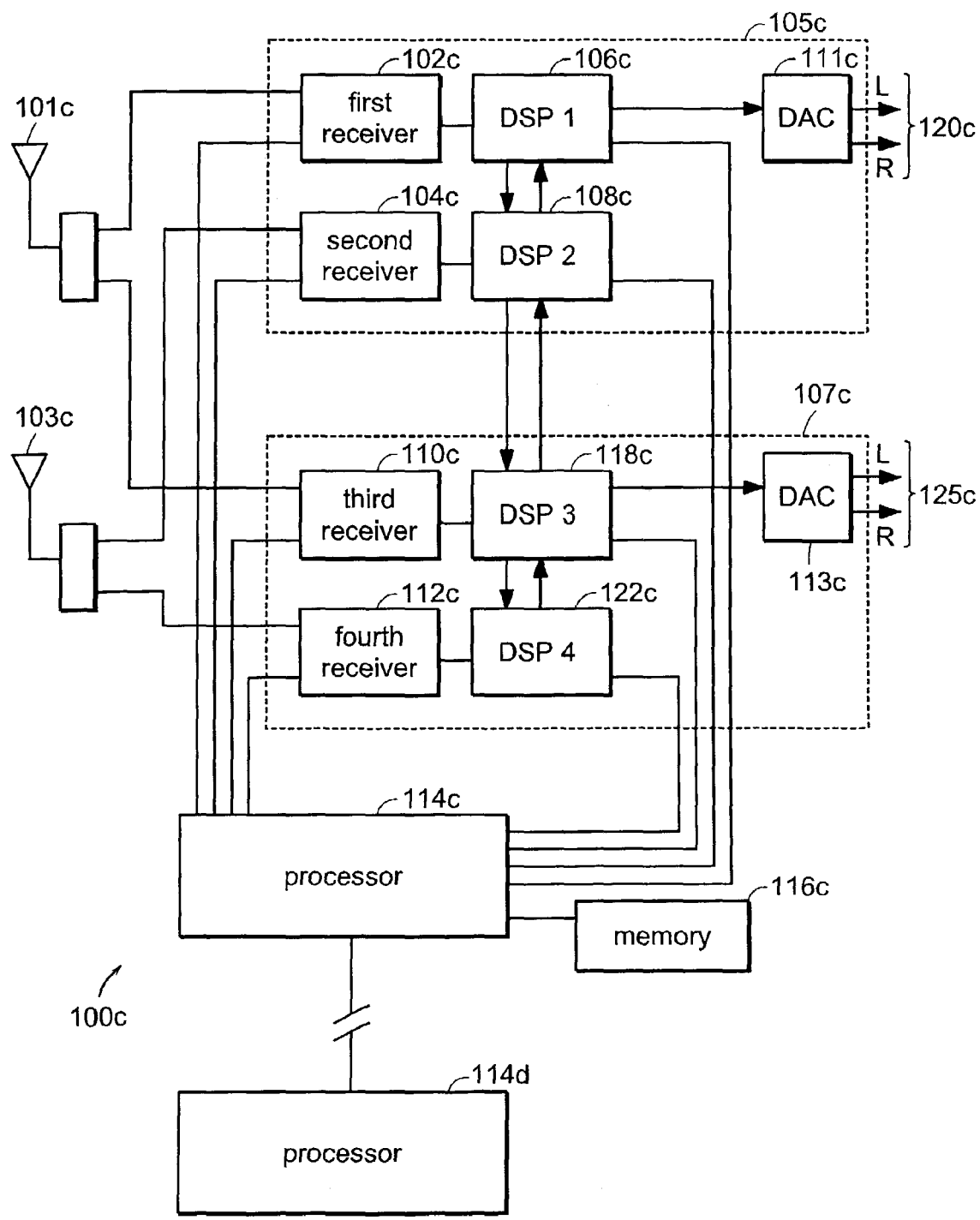
Figure 1D:
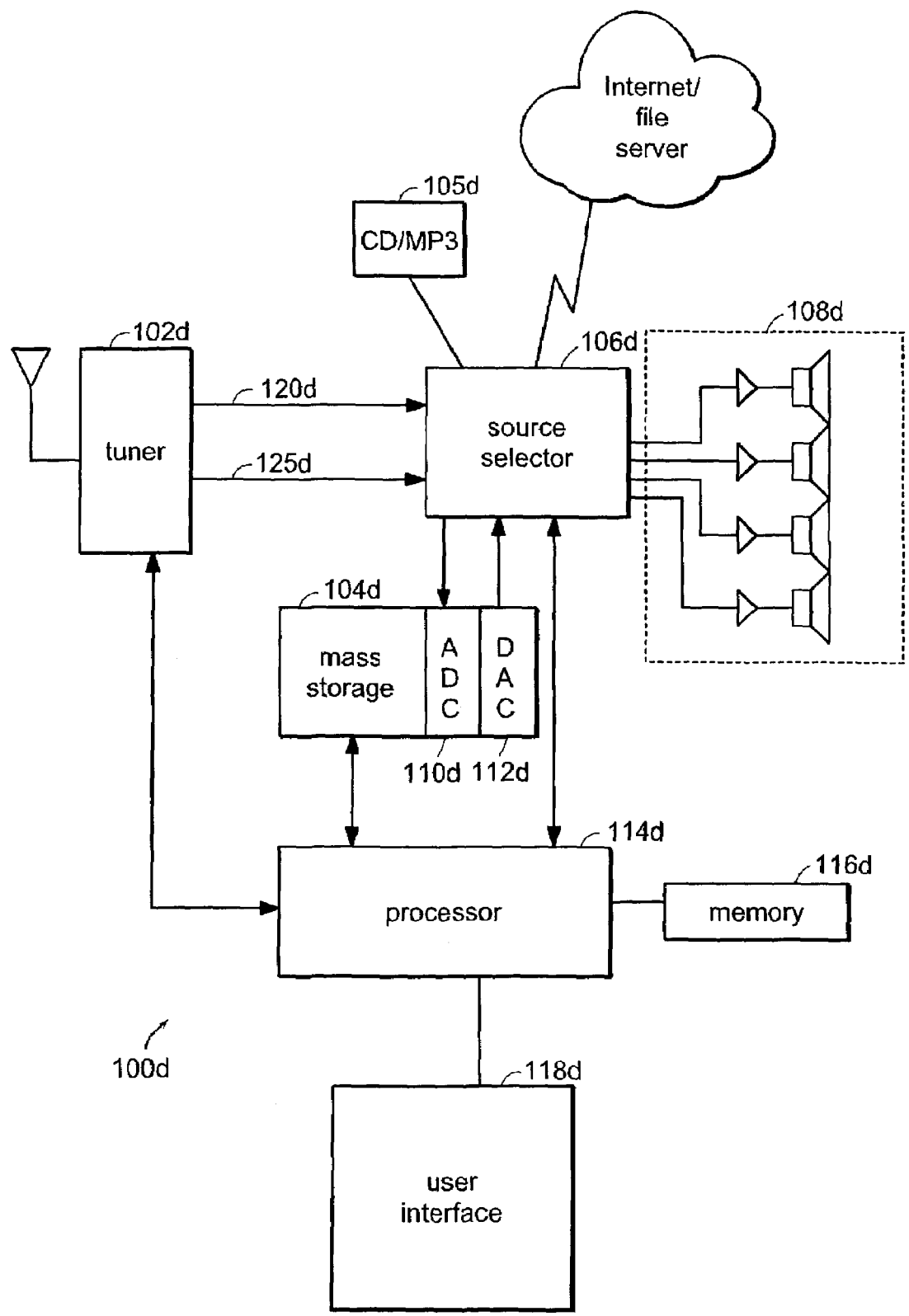

FIGS. 1a, 1b and 1c show simplified diagrams of systems 100a, 100b and 100c, respectively, each examples of systems capable of receiving broadcast signals in accordance with embodiments of the present invention. FIG. 1a depicts an analog system implementation, FIG. 1b shows a digital system implementation, and FIG. 1c illustrates a diversity system implementation. Systems 100a, 100b and 100c are components of a larger system, an example of which is depicted in FIG. 1d. Block 100d may represent systems 100a, 100b or 100c in various embodiments.

With reference now to FIG. 1a, system 100a includes a first receiver 102a, an example of which is model 1384 WFC manufactured by Microtune, configured to receive broadcast signals. First receiver 102a and second receiver 104a are shown in communication with a single antenna equipped with a signal splitter, but they may equivalently each have an independent antenna. It is assumed for the discussion of FIG. 1a that the output of receivers 102a and 104a are converted to baseband frequencies within the receivers, such that the outputs are multiplexed audio signals. When switch 122a is in the up position, as shown, a signal from receiver 102a may be communicated through switch 122a to first multiplex signal (or MPX) decoder 106a, and from there to first audio signal processing block 111a, which may send a first audio output signal 120a. Similarly, when switch 123a is in the up position, as shown, a signal from receiver 104a may be communicated to MPX decoder 107a and on to audio signal processing block 113a, which may send second audio output signal 125a. Switches 122a and 123a may be affected by a control signal from processor 114a, and may be operated in tandem or independently to select between signals from first receiver 102a or second receiver 104a.

The purpose of switches 122a and 123a are to allow signals from either of receivers 102a and 104a to be available at audio outputs 120a and 125a. Which signals are made available may be determined by processor 114a (possibly in combination with processor 114d). It should be understood that switches 122a and 123a may be located in different places within the signal path and still accomplish the desired purpose, and the invention is not limited in the specific placement of this switch function within the system.

MPX decoders 106a and 107a may be any known component capable of performing functions necessary to demodulate a multiplexed signal, such as pilot tone dependent mono/stereo switching as well as "stereo blend" and "high cut" functions, separating right and left channel signals from a multiplexed signal, and canceling the pilot tone. Audio signal processing blocks 111a and 113a may consist of gain stages, equalization, dynamic range adjusting circuitry, amplification, tone controls or other commonly known audio signal processing functions.

Signals received by receiver 102a and 104a may additionally be communicated to supplemental data decoders 108a and 110a. Supplemental data decoders 108a and 110a may be any known component capable of recovering supplemental data from a broadcast signal. Such component may include an integrated third order sigma delta converter, which samples an MPX signal, and a 57 kHz bandpass filter, which selects the frequency on which supplemental data information is transmitted. The component may also include processing that synchronizes the bitwise supplemental stream and includes error detection and error correction algorithms. An example device is the model TDA7333 integrated circuit manufactured by ST Electronics.

Supplemental data decoders 108a and 110a and A/D converter 112a may be in communication with processor 114a. Processor 114a is capable of sending a control signal to affect switches 122a and 123a, and may be in communication with receivers 102a and 104a to direct reception of broadcast signals. Processor 114a may also be in communication with memory device 116a, which may be any device permitting the of storage and retrieval of data, and may be used to store data processed in accordance with the methods further described below. Processor 114a may also be in communication with processor 114d when system 100a is incorporated into larger system 100d.

While FIG. 1a shows a system with two separate pairs of audio outputs (120a and 125a), useful systems may be constructed using only one pair of audio outputs (e.g., only 120a). A system having two pairs of outputs may simultaneously play back audio from one source (e.g., receiver 102a) while recording audio to a mass storage device from another source (e.g., receiver 104a). Uses of this capability are further described below. If the ability to simultaneous playback and record from separate receivers is not desired, then switch 123a, MPX decoder 107a, and audio processor 113a may be eliminated.

FIG. 1b shows a simplified diagram of a digital system implementation of a system 100b capable of receiving broadcast signals in accordance with the present invention. First receiver 102b and second receiver 104b are shown in communication with one antenna equipped with a signal splitter, but they may equivalently each have an independent antenna. It is assumed for the discussion of FIGS. 1b and 1c that the output of receivers 102b, 104b, 102c, 104c, 110c and 112c may be converted to IF frequencies within the receivers. Downconversion to audio frequencies may be performed within DSP blocks 106b, 107b, 106c, 108c, 118c and 122c. Receivers 102b and 104b are shown in communication with DSP blocks 106b and 107b, respectively, which are in turn in communication with each other to permit the selective reception of signals from receiver 102b or receiver 104b. DSP blocks 106b and 107b each may comprise a number of components: A/D converters 130b and 131b, which may receive signals from one receiver, as shown; switches 132b and 133b, which may select the reception of signals from either receiver 102b or receiver 104b, and which are capable of sending a signal to supplemental data decoders 138b and 139b, and to MPX decoders 140b and 141b, respectively; signal transmission blocks 134b and 135b, in communication with A/D converters 130b and 131b, respectively; and signal reception blocks 136b and 137b, in communication with switches 132b and 133b, respectively, to permit communication of signals between DSP blocks 106b and 107b. MPX decoders 140b and 141b are capable of transmitting a signal to digital-to-analog (D/A) converters 111b and 113b, respectively. D/A converters 111b and 113b are capable of sending audio output signals 120b and 125b, respectively. Audio signal processing may also be included (not shown) and would operate on the output of the MPX decoders.

It should be understood that the functions performed by switches 132b and 133b may be located in different places within the system and thus that the presence of switches 132b and 133b is not required. As such, the invention is not limited in the specific placement of this switch function within the system. For example, switching may occur within the DSP, or may be performed external to the DSP (for example, within source selector 106d in FIG. 1d).

Processor 114b may be in communication with DSP blocks 106b and 107b, to control the function of the various components therein, and with receivers 102b and 104b to direct reception of broadcast signals. Processor 114b may also be in communication with memory device 116b, which may be any device permitting the of storage and retrieval of data, and may be used to store data processed in accordance with the methods further described below. Processor 114b may also be in communication with processor 114d when system 100b is incorporated into larger system 100d.

While FIG. 1b shows a system with two separate pairs of audio outputs (120b and 125b), useful systems may be constructed using only one pair of audio outputs (e.g., only 120b). A system having two pairs of outputs may simultaneously play back audio from one source (e.g., receiver 102b) while recording audio to a mass storage device from another source (e.g., receiver 104b). Uses of this capability are further described below. If the ability to simultaneous playback and record from separate receivers is not desired, then only communication of data from DSP 107b to DSP 106b is required, and DAC 113b may be eliminated.

FIG. 1c shows a simplified diagram of a diversity system implementation of a system 100c capable of receiving broadcast signals in accordance with the present invention. FIG. 1c shows two antennae, 101c and 103c, both in communication with diversity blocks 105c and 107c, to permit the functioning of a diversity system as well as the reception of broadcast signals in accordance with the present invention. Many of the elements of system 100c may be understood with reference to the components of system 100b show in FIG. 1b. For example, receiver 102c is roughly analogous in structure and function to receiver 102b. Similarly, DSP block 106c in diversity block 105c is analogous in structure and function to DSP block 106b. However, diversity blocks 105c and 107c comprise a combination of two receiver blocks and two DSP blocks, as shown. Signals from antenna 101c may be received by receivers 102c and 110c, and signals from antenna 103c may be received by receivers 104c and 112c. Within diversity block 105c, DSP blocks 106c and 108c are in communication with each other, and within diversity block 107c, DSP blocks 118c and 122c are in communication with each other, to permit the selection of reception of signals from either antenna 101c or antenna 103c. Methods of processing signals in a diversity system that permit the reception of signals from multiple antennas are discussed in U.S. Pat. No. 5,697,084 titled Reduced Multipath Fading Using Adaptive Filtering, which is herein incorporated by reference. Diversity blocks 105c and 107c may also be in communication with each other to permit the selective reception of signals from receiver pair 102c/104c or receiver pair 110c/112c. DSP block 106c is in communication with D/A converter 111c, permitting the transmission of audio output signal 120c; similarly DSP block 118c is in communication with D/A converter 113c, permitting the transmission of audio output signal 125c.

Processor 114c is in communication with receivers 102c, 104c, 110c and 112c to direct reception of broadcast signals, and with DSP blocks 106c, 108c, 118c and 122c to control the function of the various components therein. Processor 114c may also be in communication with memory device 116c, which may be any device permitting the of storage and retrieval of data, and may be used to store data processed in accordance with the methods further described below. Processor 114c may also be in communication with processor 114d when system 100c is incorporated into larger system 100d.

While FIG. 1c shows a system with two separate pairs of audio outputs, useful systems may be constructed using only one pair of audio outputs. A system having two pairs of outputs may simultaneously play back audio from one source (e.g., receiver 102c or 104c) while recording audio to a mass storage device from another source (e.g., receiver 110c or 112c). Uses of this capability are further described below. If the ability to simultaneous playback and record from separate receivers is not desired, then simplification of system 100c is possible. Second diversity block 107c may be replaced with a single receiver and DSP, analogous to components 104b and 107b of FIG. 1b. DAC 113c is no longer required.

Now referring to FIG. 1d, system 100d depicts a simplified system application diagram in accordance with one embodiment of the present invention. Tuner block 102d represents any block of components capable of the reception and processing of broadcast and supplemental data in accordance with the present invention. Tuner block 102d may be, for example, system 100a, system 100b, or system 100c. Tuner block 102d is shown in communication with one antenna, but this is merely illustrative, and in fact tuner block 102d may be in communication with multiple antennae to permit the reception of broadcast signals as required by an embodiment. Tuner block 102d may send audio output signals 120d and 125d to source selector 106d, which signals may be analog or digital. (Audio output signals 120d and 125d may be analogous to signals 120a, 120b and 120c, and to 125a, 125b, and 125c, respectively.)

Source selector 106d may be any component capable of permitting the selection of a signal from among multiple signal sources. Source selector 106d may receive audio output signals 120d or 125d from tuner block 102d, or it may receive a signal from mass storage device 104d via D/A converter 112d to permit the playing of a recording, or it may be in communication with a information network such as the Internet, or it may receive a signal from any number of other input devices such as a CD player, MP3 player, or other similar devices 105d. Source selector 106d is also in communication with speakers 108d, illustrated in FIG. 1d as a system of four speakers, though it may be any number of speakers as appropriate for a given application, as may be obvious to one of ordinary skill in the art. Source selector 106d may also send a signal for recording to mass storage device 104d via A/D converter 110d. In the event that a signal sent to mass storage device 104d is analog, A/D converter 110d may be employed to convert the signal to a storable format; A/D converter 110d may likewise be bypassed if a record signal is digital. D/A converter 112d may be employed to convert stored data to a format renderable into audio output and may send a signal to source selector 106d. Note that A/D converter 110d and D/A converter 112d are shown having one input/output signal, but this is merely representative, and equivalent embodiments may have multiple channels of input or output.

Processor 114d may be in communication with source selector 106d, to direct the selection of a signal from among multiple signal sources as described above. Processor 114d may be in communication with tuner block 102d to direct the reception of broadcast signals and to control the function of various components therein. Processor 114d may be in communication with mass storage device 104d, to direct the storage or playback of data thereon. Processor 114d may also be in communication with memory device 116d, which may be any device permitting the storage and retrieval of data, and may be used to store user selection data and other data pertaining to user interface 118d. Finally, processor 114d may also be in communication with user interface 118d, which may comprise any device or system which may permit a user to receive or input information or make selections. Examples of such a device or system may include a visual display coupled with a method of input such as buttons, knobs or other various selectors, or it may be a touch screen display, or it may be audible signals coupled with a voice recognition input system. Other embodiments will be readily apparent to one of ordinary skill in the art. User interface 118d is discussed in greater detail below.

Figure 2:
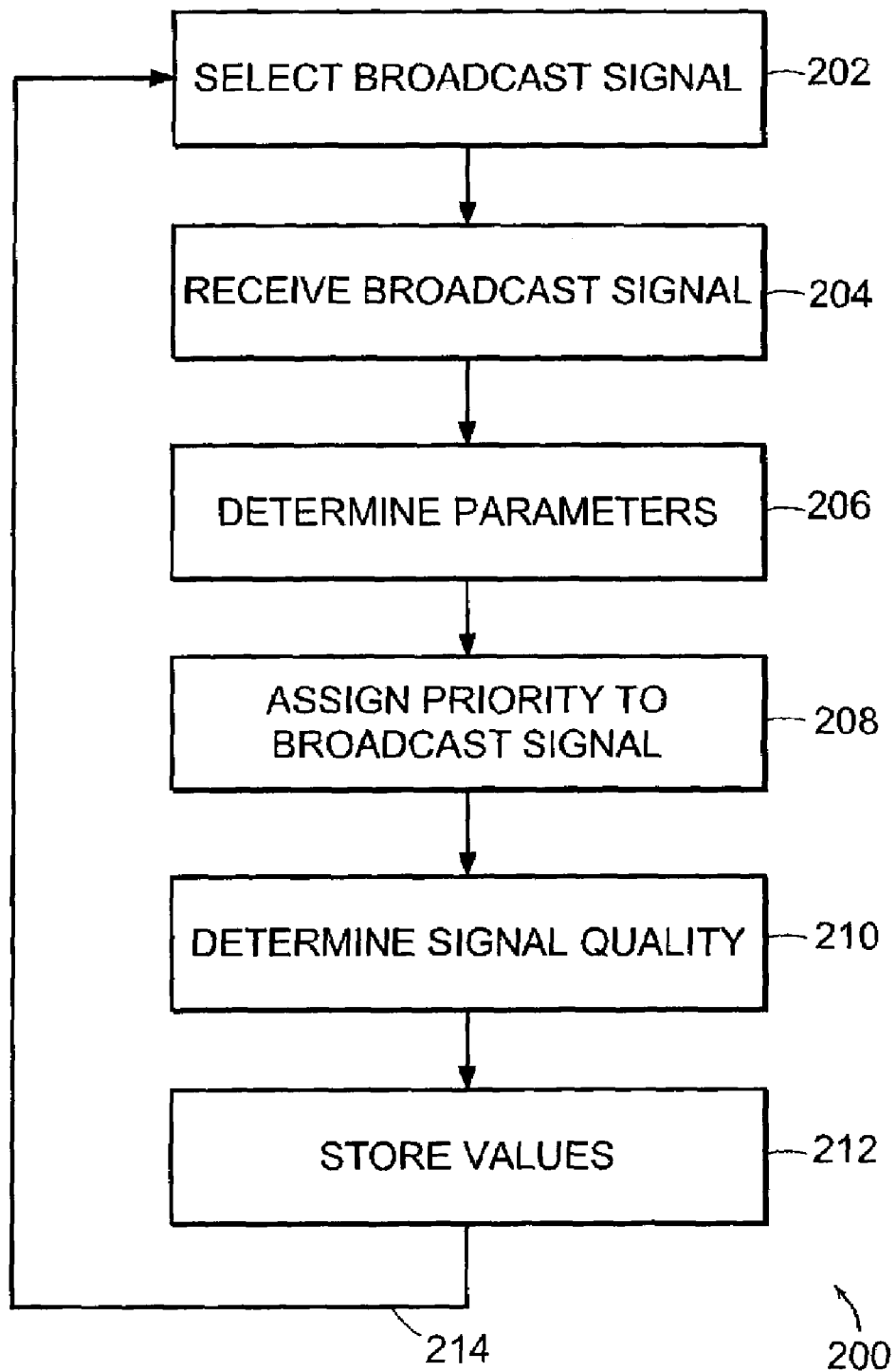
FIG. 2 depicts a block flow diagram of a method of scanning and characterizing broadcast signals in accordance with one embodiment of the present invention.

FIG. 2 depicts a block flow diagram of a method 200 of scanning and characterizing broadcast signals in accordance with one embodiment of the present invention. The method may permit a system, such as one similar to those depicted in FIGS. 1a-c, to cycle through a range of receivable broadcast signals and to continuously determine and update parameters regarding those broadcast signals. In one embodiment of the invention, a system may be employed, for example, to receive an FM broadcast with a first receiver (hereafter referred to as "foreground reception" of a "foreground signal" by a "foreground receiver"), while simultaneously gathering data regarding other receivable stations by second receiver (hereafter referred to as "background scanning" of a "background signal" by a "background receiver") at the direction of a processor. Method 200 may permit background scanning of all receivable broadcast signals, the collection of supplemental data from background signals, and the determination of whether the signal quality of a foreground signal is the best possible relative to other receivable broadcast signals. Parameters may be determined regarding a range of broadcast signals received by a background receiver regardless of whether supplemental data is received in the foreground receiver.

First, a broadcast signal may be selected 202 from a range of such signals, for example, all receivable frequencies in the FM frequency band. Next, the selected broadcast signal may be received 204, and parameters about the broadcast signal may be determined 206. Parameters may include, for example, the presence of a broadcast signal at a particular location (for example, at a given frequency), the strength of the signal, the presence of supplemental data in the broadcast signal (for example, RDS data), the supplemental data error rate, the program identification code, the program string, and the program type value. Parameters may also include the values of the supplemental data associated with the broadcast signal, such as the PI, PS, PTY, AF, TP/TA, RF, TMC, and RT.

Next, a priority may be assigned 208 to the broadcast signal based on the parameters determined. The assigned priority may be used to determine an amount of scanning time allocated to a broadcast signal, as further described below.

Next, a value for signal quality of each broadcast signal may be determined 210. This signal quality value may be used to further rank the highest priority broadcast signals. The calculation of signal quality is discussed below.

The parameters, the assigned priority and the determined signal quality for each broadcast signal may be stored in memory 212. Finally, a next broadcast signal may be selected 214, and the cycle may then be repeated. The cyclical repetition of method 200 permits the parameters regarding each receivable broadcast signal to be redetermined and updated over time.

The amount of time required to continuously scan each receivable broadcast signal and determine its parameters creates difficulties in maintaining useful parameter values for each broadcast signal. The amount of time necessary to receive supplemental data depends on the amount of data transmitted at a particular point in time (when a song is playing, for example) and the data transmission rate. In the RBDS system, typically a 57 KHz carrier is modulated to provide an overall data transmission rate of 1187.5 bits per second. According to the RBDS specification, the minimum amount of supplemental data broadcast (if supplemental data is being broadcast) is one group, or 104 bits; it is also possible that more than one unique data group may be broadcast in association with particular program data. In the US, there are 102 allocated frequencies for FM broadcast, in Europe there are 206, and in Japan there are 141.

Therefore, in order to optimize the processor duty cycle required for method 200, the priority assigned to each broadcast signal is employed to algorithmically determine scanning times for broadcast signals, such that a duration of scanning time corresponding to the assigned priority may be assigned to each broadcast signal. Two factors are considered to permit the optimization of the processor duty cycle: (1) certain characteristics of the broadcast signal, and the presence or absence of certain supplemental data are used to assign a priority to each broadcast signal; and (2) for broadcast signals of the highest priority, a value of signal quality is determined and used to further rank those broadcast signals.

Certain signal characteristics as well as the presence or absence of certain supplemental data may be used in the assignment of a priority. Greater weight may be assigned, for example, to a broadcast signal which has a signal strength greater than a predefined minimum. Greater weight may also be assigned to a broadcast signal which is identified as an alternate frequency, or which carries or is currently broadcasting a traffic announcement, or which has the same PI or regional PI code as a selected broadcast signal being received by the foreground receiver, or which carries radio text or EON data. Conversely, less weight may be assigned, for example, to a broadcast signal which lacks supplemental data.

Additionally, user selections may be factored into an assigned priority. For example, using user interface 118*d*, a user may indicate a desire to hear, for example, traffic announcements. In such case, a higher priority may be assigned to a broadcast signal identified as having that information (by means of, for example, detection of TA or TP data, or of TMC data). Other examples include enabling switching to alternate frequencies (AF), selecting a preference for regional or non-regional broadcasts, and selecting a preference for broadcasts with TMC data.

As parameters change over time, the priorities assigned to each broadcast signal may be promoted or demoted. Higher priority broadcast signals may consequently be assigned greater scanning time, while lower priority broadcast signals may receive correspondingly less duty cycle time. In one embodiment of the invention, one of four priorities may be assigned, A, B, C and D, with A being the highest and D being the lowest priority.

FIG. 3 shows table 300 of tests that may be performed to determine the priority to be assigned to a broadcast signal. In an embodiment of the invention, the tests may be performed in sequence, with each subsequent test modifying the priority ultimately assigned to a broadcast signal. In table 300, an "X" indicates that the parameter in a cell is a "don't care" condition for that test, "0" means the parameter in the column of interest is not detected, "1" indicates the parameter is detected, and "OR" indicates a test where either condition, or both conditions, may be met.

Test 1 examines the RF level 306 and RDS data present 308 parameters. If, as in row 326, the RF level detected is below a set threshold and no RDS data is present, the broadcast signal is given the lowest priority D. However, if either the RF level is above a set threshold or RDS data is present, the priority is set to C (row 328).

Test 2 determines whether TMC messages are possibly being currently transmitted or not. The determination may be made by detecting the presence of either the "3A" or "8A" group type identifier which is contained within a "B" RDS block of data, as set forth in the RBDS standard. Upon detection of such an identifier, this flag is set (1) (column 322). Through empirical field testing the transmission of these identifiers has been found to be infrequent. In one embodiment, a counter-based methodology is used to clear this value. The number of times a broadcast signal is scanned is stored in memory; if no identifiers are found within 50 interrogations, then the "TMC possible" value is reset to (0) and the priority may be lowered if all other tests indicate to do so.

Test 3 determines whether radio text is found 318, and whether the radio text data is complete or useful 320. ("Useful" data is data which can be successfully parsed, and is further described below.) Data in column 320 may be presented as a two-digit number, the first digit signifying whether the radio text string is complete (1) or incomplete (0), the second digit signifying whether the text data may be parsed (1) or not (0). If, as in row 332, radio text is present, and the data received is incomplete and not useful, priority is set to B. If radio text is present and the data is incomplete but useful (row 334), priority is set to B. If radio text is present, and the data is complete but not useful (row 336), then priority is lowered back to C. If radio text is present and the data is both complete and useful (row 338), priority is set to B.

In test 4, if the broadcast signal received in the background is included in the AF list associated with the broadcast signal received by the foreground tuner, the priority is set to B (row 340).

Test 5 detects traffic data, and is performed if TP mode has been selected by a user (i.e., a user has enabled the system to search for stations that contain traffic data, shown by a value of 1 in the "TP Mode On" column 314). If TA data (traffic data) is present, the priority is set to B (row 342). If TP is detected (i.e., the frequency is capable of broadcasting traffic data), the priority is set to B (row 344). If both TP and TA are present (i.e., the frequency is capable of broadcasting traffic data and is currently broadcasting traffic data), then the priority is set to A (row 346).

Test 6 detects the PI (program identifier) 304 of the selected broadcast signal. If the PI of the background broadcast signal matches the PI of the foreground broadcast signal but the received RF level (of the background signal) is below a threshold and the RDS present flag is set to "0," row 348, then the priority is set to B. If there is a PI match, and either the RF level is sufficient or RDS data is received, row 350, then the priority is set to A. It is possible to have a PI match without RDS data present at that moment because the PI is stored until it is updated. For example, upon entering a tunnel the RDS data may disappear temporarily but memory of the PI would still exist.

Finally, in test 7, if the background broadcast signal is the same as the foreground broadcast signal (row 352), the priority is set to A.

Among the group of highest priority broadcast signals, the signal quality of a broadcast signal is also considered to permit the optimization of the background scanning duty cycle. In a geographical area with a dense concentration of broadcast stations, for example, there may be a large number of broadcast signals that the system may prioritize into the higher priority categories. It is logical that broadcast signals having the highest signal quality be monitored more closely, as they are the most likely broadcast signals which the system may be directed to receive at some future time.

In one embodiment of the present invention, signal quality may be determined as a weighted average of both the instantaneous and time-averaged received signal strength, and the instantaneous and time-averaged error rate of the supplemental data received. There are numerous equivalent methods of calculating the signal quality, and any other manner of determining signal quality permitting the described advantages may be used.

In one embodiment, a value for an intermediate variable, here called "Q", is determined. The value of Q may be between 0x00 and 0xFF (providing that the weighting values are correctly adjusted), and may be calculated accordingly:

$$Q = [(\text{<RF\_weight>}/255) * \text{'RF level'}] + [(\text{<ERROR\_weight>}/255) * \text{'average RDS block error rate'}]$$

<RF_weight> is a weighting contribution factor of the 'RF level'. A suitable value for <RF_weight> may be determined through experimentation. <RF_weight> may be between 0x00 and 0xFF. According to empirical field testing, an optimal value for <RF_weight> is 0x80, that is, 50% contribution.

'RF level' is a scaled version of an ADC measurement in volts of the field strength output of the background tuner. An example of such an ADC device is the MAX127 manufactured by Maxim. Full scale output is set to 5V input, and is converted with 12 bit resolution. For a field strength of 60 dBuV, the output voltage of the MAX127 is 2.8 V. When using the MAX127 device the output value from the ADC may be divided by 40.96 to provide a scale with 100 steps. Each step corresponds to 50 mV. 'RF level' can be between 0x00 and 0x64, where the higher the number the stronger the signal field strength. This measurement may be made at the completion of the time period during which the background frequency is scanned.

<ERROR_weight> is the weighting contribution factor of the 'average RDS block error rate'. A suitable value for <ERROR_weight> may be determined through experimentation. <ERROR_weight> may be between 0x00 and 0xFF. Experimentation reveals that an optimal value for <ERROR_weight> is 0x80, that is, 50% contribution.

'RDS block error rate' relates to the ratio of good RDS blocks received versus the number of blocks that could possibly be received during the time period that the background frequency is selected for (based on the max rate of one block every 22 mS). This ratio may be then multiplied by 100 and is stored as a percentage. Values for 'RDS block error rate' may vary between 0x00 and 0x64, where 0x64 indicates that all possible blocks were successfully received as valid blocks (100%).

Each received RDS block is automatically error-corrected by the RDS decoder, which may report whether the received block was successfully corrected or not. If the block was not successfully corrected, then the block is calculated as having an error. The 'average RDS block error rate' may then be calculated as the moving average of 'RDS block error rate.' The two previous values for 'RDS block error rate' and the present value for 'RDS block error rate' are used in this calculation:

$$\text{'average RDS block error rate'} = (RdsQ_{(k-2)} + RdsQ_{(k-1)} + RdsQ_{(k)})/3.$$

For example, assuming the following values:

| | |
|---|---|
| <RF_weight> = | 0x80, |
| 'RF level' = | 0x40 (3.2 V), |
| <ERROR_weight> = | 0x80, and |
| 'average RDS block error rate' = | 0x32 (50%), |

Q can then be calculated as follows:

$$Q = (128/255 * 64) + (128/255 * 50) = 57.22 = 0x39$$

The value of Q may be calculated and stored in memory each time the background receiver selects a broadcast signal. A value Avg Q may then be calculated by averaging the previous value of Q with the current value of Q for that same broadcast signal:

$$\text{Avg } Q = (Q_{(k-1)} + Q_{(k)})/2$$

such that:

| | Time | | | | |
|---|---|---|---|---|---|
| | T0 | T1 | T2 | T3 | T4 |
| 'Q' | 10.0 | 20.0 | 20.0 | 10.0 | 15.0 |
| 'Avg Q' | 10.0 | 15.0 | 20.0 | 15.0 | 12.5 |

At time T0, no previous values of Q exist, so the Avg Q value is not calculated and is made to be equal to Q. At time T1, the Avg Q value is calculated by summing the Q values at times T1 and T0 and dividing by 2.

Using the above-determined values, a calculation for signal quality may be made. Again, two weighting factors are used, <Q_weight> and <AvgQ_weight>. Experimentation has shown that a useful value for <Q_weight> may be 0x80, and that an optimal value for <AvgQ_weight> may be 0x80, with 50% contribution from each. Signal quality may thus be calculated:

signal quality=[(<Q_weight>/255)*(Q/255)]+
[(<AvgQ_weight>/255)*(Avg Q/255)]

The assigned priorities (and the signal quality for the highest priority broadcast signals) are employed to algorithmically allocate duty cycle time to background scanning of broadcast signals. In one embodiment of the invention, the total time for a complete duty cycle may be represented as:

$$T_{cycle}=[(p_{time}*10 \text{ mS})*w_{freq}]+[(q_{time}*10 \text{ mS})*x_{freq}]+[(r_{time}*10 \text{ mS})*y_{freq}]+[(s_{time}*10 \text{ mS})*z_{freq}]$$

where the variables $p_{time}$, $q_{time}$, $r_{time}$ and $s_{time}$ relate to the time that each broadcast signal is scanned (time variables), and the variables $w_{freq}$, $x_{freq}$, $y_{freq}$ and $z_{freq}$ relate to the number of broadcast signals of each of four priorities scanned in a duty cycle (count variables). In one embodiment, the time variable may denote a multiple of 10 mS during which each broadcast signal of a priority group is scanned. This duration permits the collection of supplemental data from each broadcast signal and for the calculation of signal quality. The time variable for each priority may be different in different geographic locations (for example, because the density and allocation of frequencies may differ from North America and Europe). The time variable values given in the table below were determined to be useful from empirical testing.

|  | A | | B | | C | | D | |
|---|---|---|---|---|---|---|---|---|
| Location | Time Variable | Scan Time | Time Variable | Scan Time | Time Variable | Scan Time | Time Variable | Scan Time |
| Europe | 30 | 300 mS | 30 | 300 mS | 15 | 150 mS | 8 | 80 mS |
| North America | 30 | 300 mS | 400 | 4 sec | 15 | 150 mS | 8 | 80 mS |

The count variable describes the number of frequencies of each priority which may be scanned during each duty cycle. Priorities may be cyclically scanned in decreasing order or priority, A through D. Values for the count variables in the following table were determined to be useful for North America and Europe through empirical testing.

|  | A | B | C | D |
|---|---|---|---|---|
| Location | Count Variable | Count Variable | Count Variable | Count Variable |
| North America | 6 | 6 | 4 | 4 |
| Europe | 6 | 6 | 4 | 4 |

The total time for one cycle may therefore be calculated to be:

For Europe:

(300 mS*6)+(300 mS*6)+(150 mS*4)+(80 mS*4)=4,520 mS.

For North America:

(300 mS*6)+(4000 mS*6)+(150 mS*4)+(80 mS*4)
=26,720 mS.

As described above, data regarding each broadcast signal and its assigned priority may be maintained in memory. The system may scan "count variable" number of broadcast signals from each priority group, A through D. Broadcast signals of priorities B, C and D may be scanned sequentially (e.g., from lowest to highest frequency). Broadcast signals from the A priority list, however, may be scanned in the order of their signal quality. The foreground broadcast signal (which always has priority A) is scanned once each cycle, and is typically scanned first. The best alternate broadcast signal (e.g., the frequency in the A list having the highest signal quality value of all remaining frequencies) is scanned every cycle and is typically scanned second. The second best alternate broadcast signal (again ranked according to signal quality) in the A list is scanned every cycle and is typically scanned third.

The remaining broadcast signals of the A list may then be scanned in order, e.g. from lowest to highest frequency; if the entire A list cannot be scanned in a single loop, the scan of the remaining broadcast signals may continue in the next loop. A broadcast signal typically is not scanned twice in the same loop. After "count variable A" number of frequencies have been scanned, "count variable B", "count variable C", and "count variable D" frequencies of B, C, and then D priorities are scanned. For every loop, broadcast signals in priority lists B, C and D are typically scanned in ascending (e.g., frequency) order.

It should be noted that changes in signal quality over time may also be monitored and may be used as a factor in assigning a relative priority to a broadcast signal. A broadcast signal which is determined to have an increasing signal quality value may be assigned a relatively higher priority, and thus may receive correspondingly more scanning time. As such, the present invention may be "predictive" of, for example, the next best available broadcast signal carrying a particular program.

Among the supplementary data received is a free text or "radio text" (RT) string, the content of which is at the discretion of the transmitter of the broadcast signal. Typically the radio text contains a description of a current program, for example, the title and artist of a song, but may contain any other text message the broadcaster wishes to send. The included text may or may not be related to the program data being broadcast.

Figure 4:
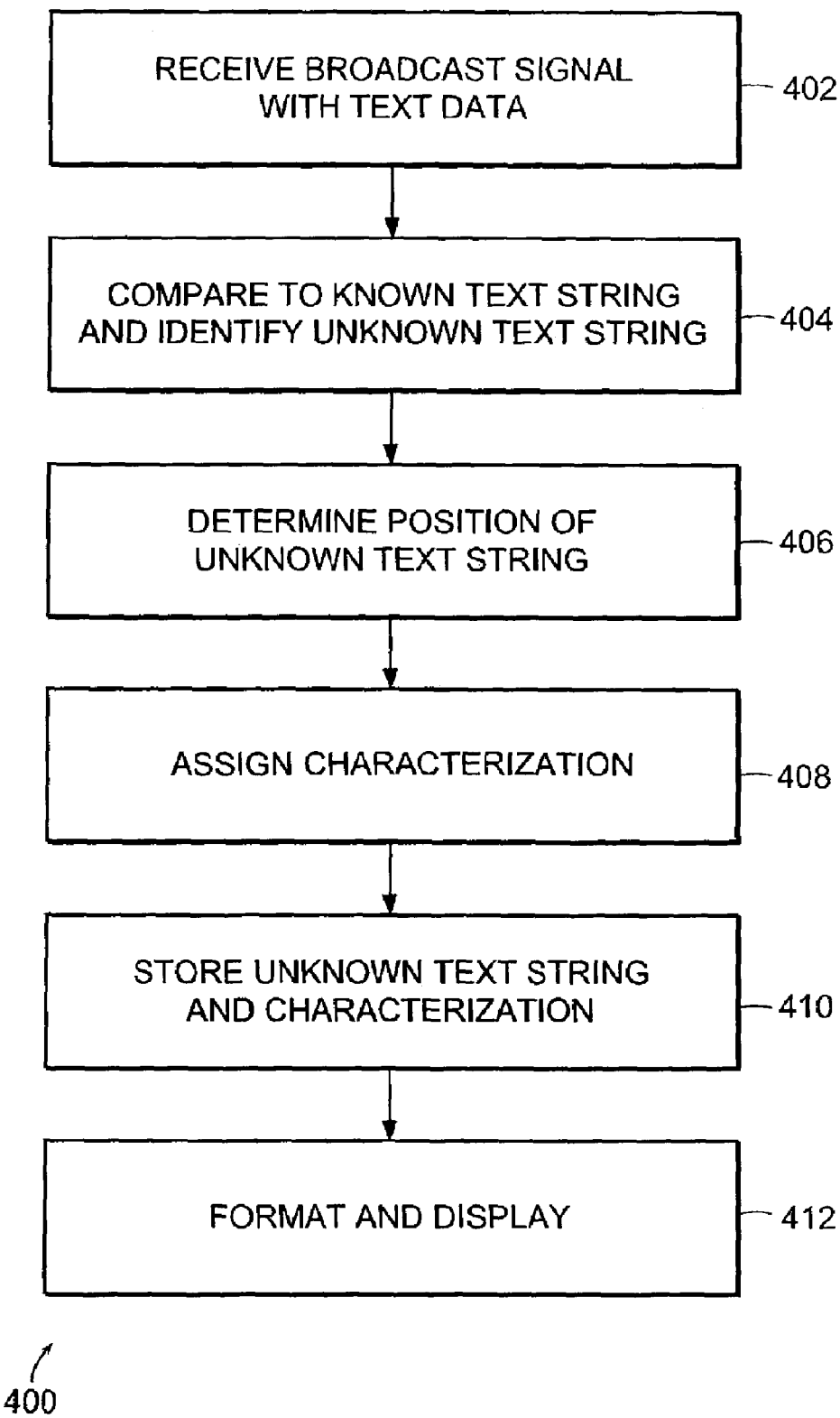
FIG. 4 depicts a flow diagram of a method 400 for parsing data from a broadcast signal.

In one embodiment of the present invention, the radio text may be parsed, and the data thus gathered may be displayed or stored in memory. FIG. 4 depicts a flow diagram of a method 400 for processing supplemental data from a broadcast signal. A broadcast signal containing text data is received 402, which text data is compared to one or more known text strings 404. From this, a distinction may be made in the received text data between text which is identical to one of the known text strings and at least one unknown data string. The position of the unknown data string or strings relative to the known text strings is then determined 406. From this determination, a characterization may be assigned to the unknown data strings 408, as further described below. The now characterized data strings are stored in memory, along with their characterizations 410 and the PI data associated with the received broadcast signal. Additionally, the characterized strings may be formatted and displayed 412, as further described below. Moreover, a user may be permitted to select a broadcast signal based on the displayed characterized strings. A user may also be allowed to make a selection based on uncharacterized strings.

Method 400 may be used in combination with method 200 shown in FIG. 2. For example, in a two receiver system, a broadcast signal may be received on the foreground receiver while simultaneously receiving other broadcast signals on the background receiver. In a system with only one receiver, broadcast signals may still be received, for example, while listening to the playback of a recording, or from any source other than the single receiver. The receivers may be receiving program data, supplemental data, or both. Thus method 400 may be employed with a system having any number of receivers.

In one embodiment, method 400 may permit a system, for example a system similar to that shown in FIGS. 1a-c, to determine the "artist" and "title" of a song being broadcast. For example, a broadcast signal may carry radio text containing the string "THICKER THAN BLOOD . . . GARTH BROOKS". In such case, " . . . " may be a known text string which may be distinguished from the strings "THICKER THAN BLOOD" and "GARTH BROOKS". From the position of these text strings relative to the known text string " . . . ", the first text string may be characterized, for example, as a title, and the second as, for example, an artist. The strings and their characterizations may be formatted and displayed, or stored in memory. The formatting may be of virtually any style, font face, or format, such as capitalization of the first or other characters, or it may be through the use of for example, separate screens, different fonts, colors, flashing text, or any number of methods for separately identifying the different classes of songs or any of several variations, as will be apparent to one of ordinary skill in the art. Different formatting may be used to visually distinguish displayed information in various ways, for example, to display currently playing songs differently from upcoming songs, or to distinguish genres, or to indicate a favorite (or disliked) artist or song or genre. The known text string may be any phrase or character, examples of which include phrases such as "UP NEXT ON" and "NOW PLAYING", and punctuation characters such as brackets, parenthesis, quotation marks, a period or group of periods, hyphens, and the like. The method may also be configured to recognize such information as "ticket sale dial-in numbers" and "promotions". For example, a broadcast station may transmit the radio text "UP NEXT ON" followed by information identifying the station, followed by information indicating the artist or the name of the song that is to be played. Method 400 may permit the recognition of the string "UP NEXT ON" and the characterization of a subsequent string as "artist". Additionally, the method may be employed to recognize and format extraneous or missing spaces or characters, as in, for example, "UP NEXT ON WMJX <BARRY WHITE>", where the brackets are considered extraneous, or "UP NEXT ON WBOSU2", where a space is considered missing between "WBOS" and "U2". The method may also permit the detection of characters within the parsed text indicating special formatting such as a forward slash, backslash, hyphen, exclamation mark, or special character groupings as an indication of special formatting such as, for example, AC/DC, WHAM! and ZZ Top. The method may also permit the stylization of, for example, collected "artist" and "song title" information for sorting and display. Other examples of possible text parsing include: recognition of Roman numerals (e.g., changing "BOYZ II MEN" to "Boyz II Men" without formatting "II" as "ii"); formatting capital and lower case (e.g., from "THICKER THAN BLOOD . . . GARTH BROOKS" to "Thicker Than Blood . . . Garth Brooks"); removing characters preceding a text string and tags such as "PLAYING SONG" and "NOW PLAYING"; removing characters following a text string and tags such as "PLAYING ARTIST"; checking strings for the presence of special characters such as ( ) or [ ] or < > at the start of a string, or after an initial word, or anywhere in a string, and removing them (e.g., parsing "U2 <1988>" to become "U2"); and recognizing alternative title/artist formats (e.g., recognizing "Another Day In Paradise-Phil Collins" and distinguishing "Another Day In Paradise" from "Phil Collins").

The method 400 may be used in concurrence with a storage device, which may function as a database of information, for example, of song titles, artists and genres, and the text strings parsed from received text data may be compared to the database for formatting and accuracy. Thus, the method may permit, for example, the stylization of parsed "artist" and "song title" information based on a comparison of the parsed text strings with stored data, and the stored format may be used preferentially over a method-determined format. For example, if a storage device, such as a computer memory, or a CD or MP3 player, associated with the present method contained an artist listing of "INXS" then this text format may be used instead of the method-formatted result of "Inxs". An associated database may also be consulted in the event that no known pattern is detected in the radio text data, in which case the radio text data may be parsed and compared with stored data, and known and unknown strings may be thus identified.

Another embodiment of the present invention may permit optimization of the reception of program data. Multiple transmitter stations in the same geographic area may simultaneously broadcast the same program data. For example, several members of the National Public Radio network in Massachusetts, USA may simultaneously broadcast the program "Car Talk." Should the signal quality of one broadcast signal drop below that of another broadcast signal having the same program data, the present invention may permit the switching of reception from the lower quality broadcast signal to the higher quality broadcast signal in a way that is undetectable by a user. In accordance with the present invention, such broadcast signals typically have the highest assigned priority, and furthermore typically have the same program identifier (PI).

Basic operation of the broadcast signal switching described above can be understood with reference to FIG. 1a. Assuming that switch 122a connects the output of first receiver 102a to the input of MPX decoder 106a, first receiver 102a may act as a foreground receiver, while second receiver 104a may act as a background receiver. Processor 114a may be configured to monitor the signal qualities of both the foreground signal and those background signals having the same PI received on the background receiver. When the signal quality of the foreground signal drops below the signal quality of one of the other monitored broadcast signals with the same PI, processor 114a may command switch 122a to switch its state such that signals from second receiver 104a may be passed to MPX decoder 106a; processor 114a may thus switch the system such that audio output 120a may be fed by the highest quality signal available.

In one embodiment, receivers 102a and 104a may be identical. In such configuration, processor 114a may switch the functions of receivers 102a and 104a between foreground receiver and background receiver functions. That is, when processor 114a commands switch 122a to change state, in addition to switching the multiplexed output signal, processor may also switch the functions of receivers 102a and 104a such that receiver 102a may function as the background receiver and receiver 104a may function as the foreground receiver. These functions may be switched back and forth between the two receivers as desired.

Alternatively, it is possible to "flip-flop-flip" the functions of the two receivers, thus maintaining one receiver essentially as the foreground receiver and the other essentially as the background receiver. First, processor 114a may direct a switch between received broadcast signals, as previously described. Next, second receiver 104a may be commanded to tune to the new, higher signal quality frequency by processor 114a. (Processor 114a may also temporarily suspend background scanning with receiver 104a.) After receiver 104a has stabilized at the new frequency, processor 114a may actuate switch 122a to change to the audio signal output from second receiver 104a. Processor 114a may then command first receiver 102a to tune to the new frequency. Once first receiver 102a has stabilized at the new frequency, processor 114a may actuate switch 122a such that the audio signal is again received from receiver 102a. After switching is complete, processor 114a may command second receiver 104a to resume background scanning. This arrangement may provide a cost advantage because it permits second receiver 104a to be a lower cost, lower quality receiver, as it is only used to provide audio output for a brief period of time during the switch events and is used primarily to gather parameter data.

Figure 1E:
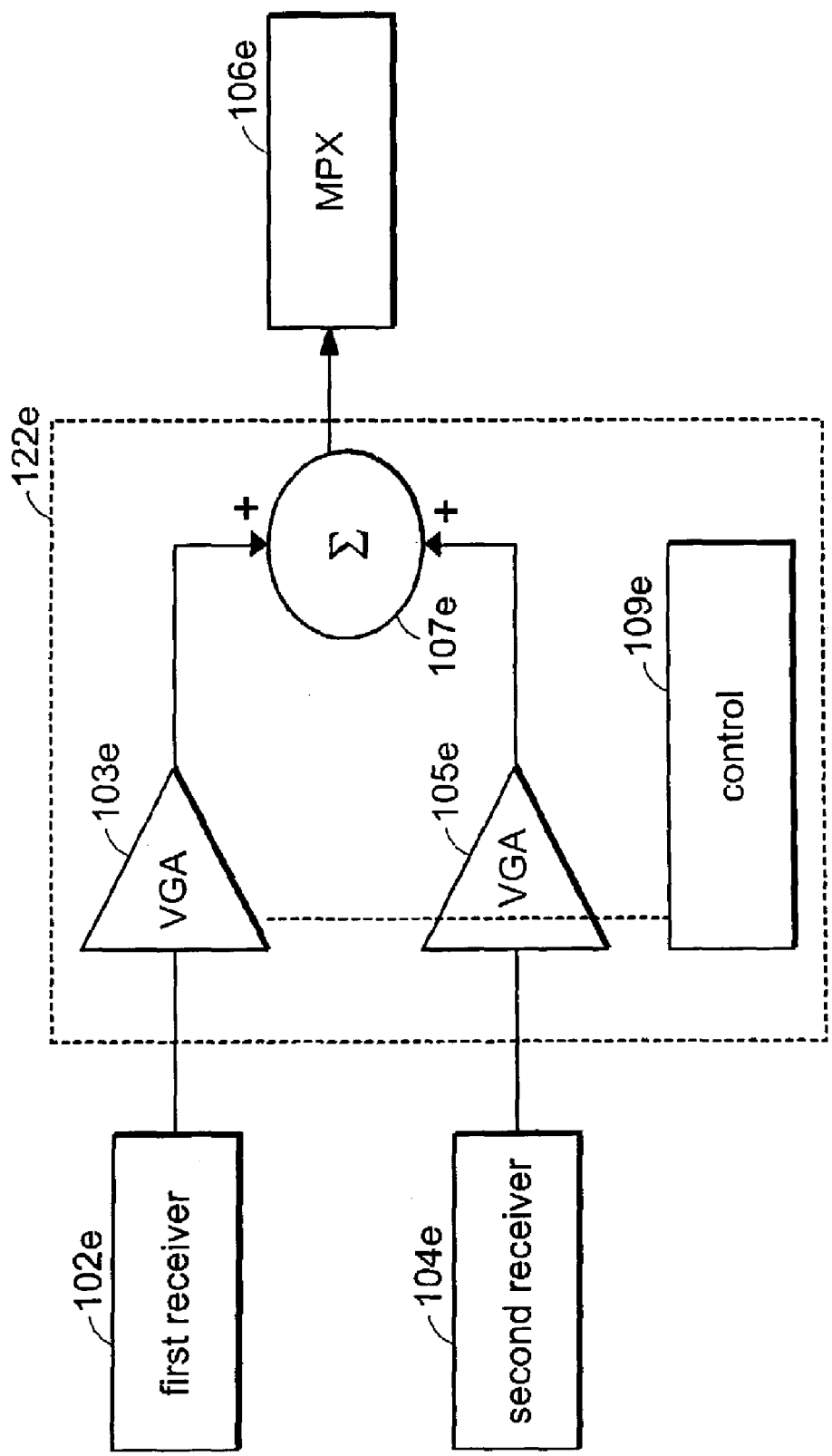
FIG. 1e depicts an alternate switch configuration.

Further improvement to the switching described above may be possible using the switch configuration shown in FIG. 1e. For example, the configuration of switch 122e may be used to reduce or eliminate audible clicks, pops, or other noises that may occur during switching. The switch configuration depicted in FIG. 1e may be used in all of the various switching modes described earlier.

The (multiplexed) outputs of receivers 102e and 104e may feed into variable gain devices 103e and 105e. (There are numerous methods of constructing variable gain devices known in the art, and the present invention is not limited in the form of device used. FIG. 1e shows variable gain amplifiers, though operational transconductance amplifiers, multipliers, or other implementations may also be used; passive devices such as digital potentiometers may be used as well.) The outputs of variable gain elements 103e and 105e feed into summer 107e, which provides an output that is the sum of its two inputs.

Switching between the multiplexed outputs of receivers 102e and 104e may be effected by varying the gain of variable devices 103e and 105e in the following manner. Assuming that receiver 102e is initially the foreground receiver, the output of receiver 102e may then be connected to MPX decoder 106e. This may be accomplished by setting the gain of variable gain device 103e to a nominal reference value, typically 0 dB, and setting the gain of variable gain device 105e to its minimum available gain, which may be at least −60 dB and preferably at least −90 dB. A processor may direct control device 109e to initiate a switch event. (Control device 109e may be an internal software process running on said processor, or it may be separate physical hardware.) Control device 109e may then rapidly decrease the gain of variable gain device 103e and may simultaneously rapidly increase the gain of variable gain device 105e. At the conclusion of the switch event, gain device 105e may be set to a nominal value, typically 0 dB, and gain device 103e may be set for minimum gain. The decrease and increase time slopes of the variable gain devices are typically less than 1 mS and ideally less than 10 μS. While the system is described here as setting a variable gain device to its minimum available gain, effective switching may be possible using some other value of gain, as long as it is sufficiently low that the input to MPX decoder 106e comes substantially from the other variable gain device.

Figure 5:
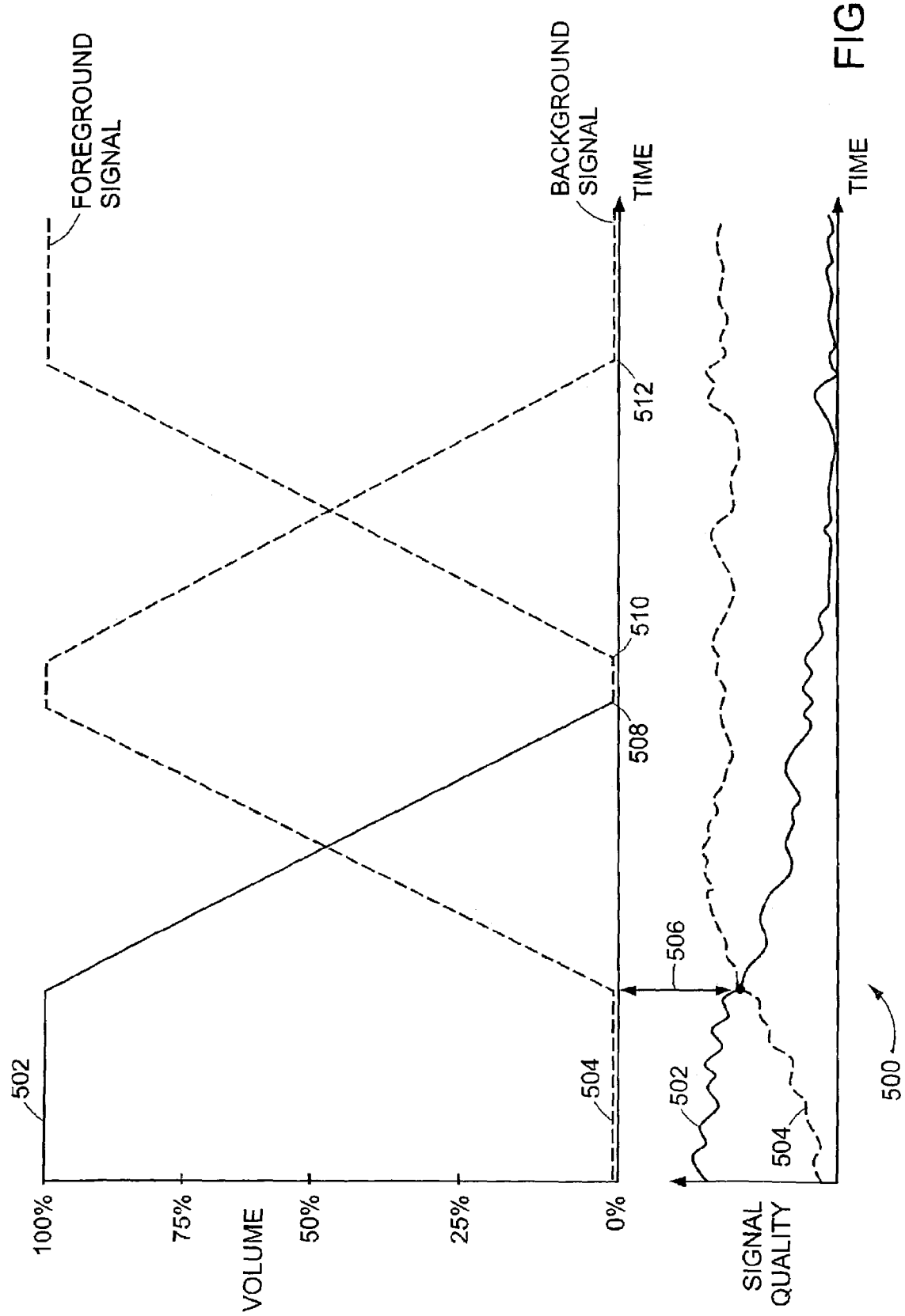
FIG. 5 illustrates one embodiment of a method of optimizing the reception of program data.
Figure 5A:
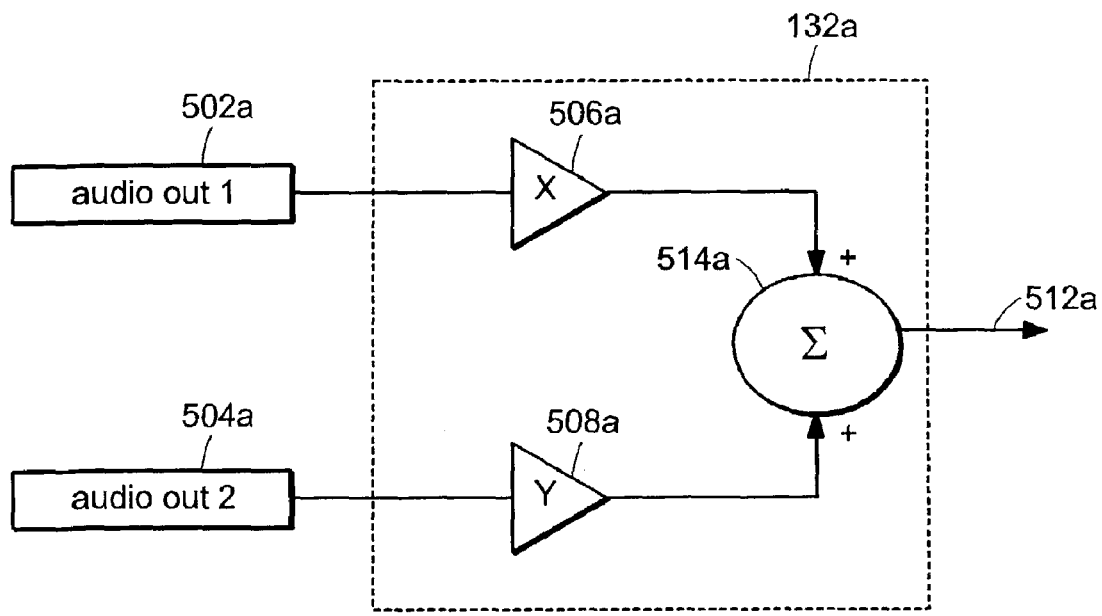
FIGS. 5a and 5b show schematic representations of digital filter implementations of a switch function.
Figure 5B:
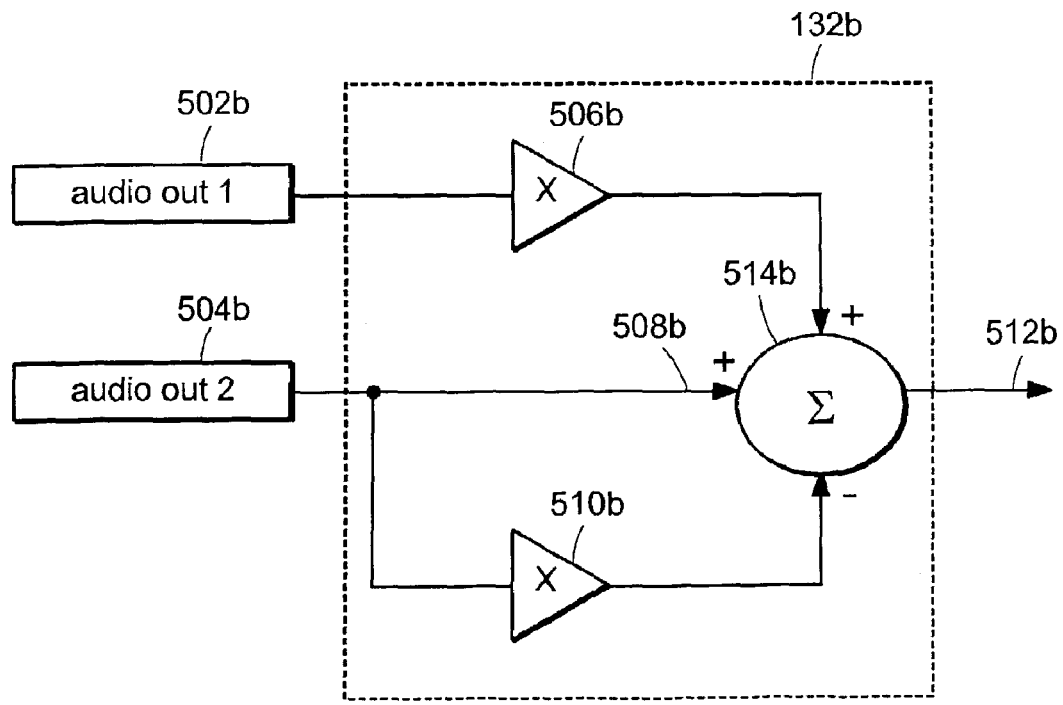

Additional alternative embodiments of a switching device are shown in FIGS. 5a and 5b, which show schematic representations of digital filter implementations of the switch function (represented, e.g., by switch 132b). FIGS. 5a and 5b represent configurations which permit digital signals at the inputs (502a, 504a, 502b and 504b) which may connect, for example, to digital outputs 130b and 131b of receivers represented in FIG. 1b. Each input signal may be multiplied by a coefficient; a signal at input 502a may be multiplied by a coefficient with magnitude X at gain element 506a, and a signal at input 504a may be multiplied by a coefficient with magnitude Y at gain element 508a. The results of the two multiplication operations may then be summed together by summer 514a. To implement the switch function, values X and Y are permitted to vary between 0 and 1, and may be selected such that Y=1−X. Changing the value of X between 0 and 1 may thus switch the output between the signals from inputs 502a and 504a. In the case Y=1−X, if X=0 then Y=1 and the signal from input 504a is passed to output 512a. In the case X=1, Y=0 and the signal from input 502a is passed to output 512a. The amount of time required to switch depends on the rate at which the coefficient values are changed. The coefficients may be changed from 0 to 1 in one time step if it is desired to immediately switch between inputs; alternatively, the values of the coefficients may be varied between 0 and 1 more slowly, taking on a range of intermediate values. The number of intermediate values and the rate of value change may be selected to minimize audible artifacts from the switch process.

FIG. 5b depicts a filter configuration in which only one coefficient value need be stored, and the value of Y may be inferred. A signal from 502b may be multiplied by a coefficient X at gain element 506b, which result is passed to summer 514b. A signal from 504b may be passed both directly to summer 514b and to gain element 510b, where it may be multiplied by coefficient X. The result of the operation at gain element 510b may then be passed to summer 514b where it may be subtracted from the total signal. The result of the summing operations are sent as output 512b. Output 512b may thus vary in accordance with the following expressions:

$$O_b = X(\text{signal } 502b) + (\text{signal } 504b) - X(\text{signal } 504b)$$

OR $$O_b = X(\text{signal } 502b) + (1-X)*\text{signal } 504b$$

Where 1−X=Y, thus $$O_b = X(\text{signal } 502b) + Y*\text{signal } 504b$$

An example of the timing of a complete frequency switch event using the switch structure of FIG. 1e is shown in FIG. 5. FIG. 5 illustrates one embodiment of a method 500 of optimizing the reception of program data. A first broadcast signal 502 may be received on a foreground receiver, and a second broadcast signal 504 may be received on a background receiver, with the program data of the foreground broadcast signal, for example, being output through speakers. In accordance with the present invention, parameters related to both broadcast signals are determined, among those parameters being, for example, signal quality. At point in time 506 where the signal quality of the first broadcast signal becomes relatively less than that of the second broadcast signal, the volume of the first broadcast signal may be reduced while the volume of the second broadcast signal may be increased. At a point in time when the volume of the first broadcast signal reaches minimum level 508, the foreground receiver may then be returned to receive the same broadcast signal as is being received by the background receiver. Next, at a point in time 510 after the foreground receiver is returned, the volume of the foreground receiver may be increased while the volume of the background receiver may be decreased. At a point in time 512 when the volume of the background tuner once again reaches minimum level, the background receiver may be free to continue background scanning. The intervals of time between points 508 and 510 may be of any duration, but must be at least long enough to permit retuning of the receiver and is typically less than 100 mS. The intervals of time between points 506 and 508 (and between 510 and 512) should be typically less than 1 mS and ideally less than 10 μS to avoid perception of the switch by a listener.

For example, at a point in time, it may be determined that the broadcast signal received on 98.1 MHz on the background receiver is of a higher signal quality than the broadcast signal being received by the foreground tuner on 105.7 MHz, and that the PI codes associated with both broadcast signals are identical indicating that the broadcast material is identical. First, the background tuner may be tuned to 98.1 MHz. Reception may then be switched to the background tuner. Next, the foreground tuner may be tuned to 98.1 MHz, and subsequently reception may be switched to the foreground tuner. The background tuner thereafter may resume background scanning. The background receiver is not limited to the reception of only one broadcast signal, but rather may receive multiple broadcast signals in accordance with the present invention.

Method 500 may be used in combination with methods 200 and 400 to provide a system with various functionalities. In one embodiment of the present invention, for example, the combination of methods 200, 400 and 500 may permit an "interrupt" function. For example, a user may indicate a desire for the preferential reception of traffic announcements. If a broadcast signal is then detected having supplemental data, indicating that a traffic announcement is currently being broadcast (such as through the TA data), the audio output may be temporarily switched to the broadcast signal carrying the traffic announcement. After the end of the traffic announcement is detected (as indicated, for example, by the TA data) the present invention may permit retuning the foreground tuner to the previous broadcast signal. This embodiment of the present invention may also permit a user to, for example, indicate a desire to listen to a particular artist when available. For example, a user may indicate a desire to listen to a song by the artist Madonna. If thereafter a Madonna song is broadcast on any receivable broadcast signal, the present invention may permit matching of data identifying the artist and the interruption the then-currently received broadcast signal. Background scanning may occur regardless of the input source, and other embodiments may permit switching from playback devices such as a CD or MP3 player to the desired broadcast signal. Searching for a particular artist or song from among current broadcasts relies on the availability of supplemental data of some form from which the artist or title may be determined; it is not, however, limited to embodiments which parse metadata from a text string. Such information may be parsed from radio text, as described earlier, or may be available already parsed, as is possible in some forms of HD radio, satellite radio, or Internet radio. Method 500 describes one method of switching operations between two receivers; it will be readily apparent to one of ordinary skill in the art that equivalent methods of switching operations exist.

Another embodiment of the invention may permit an "advanced seek" function. The location of a plurality of broadcast signals may be determined (such as the frequencies of all receivable FM, AM, or HD radio broadcast stations), those locations may be stored in memory, and changes in the presence or absence of broadcast signals may be continuously updated (in accordance with method 200). A user may indicate a desire to, for example, select the next lowest or highest available broadcast signal. The system, having the location of the next available broadcast frequency in memory, may tune the foreground receiver to that frequency directly, without scanning through any intermediate frequencies between the current tuned frequency and the next available frequency. The "advanced seek" function may thus exploit the list of all receivable broadcast signals and permit the foreground receiver to be tuned to the next available broadcast signal regardless of the presence or absence of supplemental data.

Another embodiment of the present invention may permit the skipping of unwanted program data, such as, for example, commercials. For example, from processed supplemental data, such as from parsed radio text, it may be determined that a song has ended and that a commercial is about to begin. In such case, the system may switch to another broadcast signal, or retrieve data from memory that has been recorded from another broadcast signal or other source, or switch to another source such as a CD player, before a commercial begins, such that the user effectively does not hear any commercials. In order to accomplish this, the system must reliably detect the beginning and ending of songs, so that the system knows when to switch and so that only song data is stored in memory. (Storage of song data to memory is described below.) Such detection may be based on a number of factors. The beginning of a song may be reliably detected by determining when the song title and artist appear in the radio text (and when the UP NEXT ON string is no longer present). The end of the song may be estimated based on statistical averages for different genres of music on different stations. For example, it has been determined that for radio stations playing Top 40 programming, the average song length is approximately 2 minutes 54 seconds. Other averages for other genres may be determined. The system may then use a determined average to predict the end of a song based on the time it started and the determined average length. The end of a song may also be estimated based on the detection of the UP NEXT ON string and statistical data that relate the time UP NEXT ON occurs in relation to the end of a song. Additionally, if the radio text were not readily identifiable as an "artist", "song" or "genre", it could be assumed that a commercial was playing. Thus, in one embodiment of the invention, the system may determine that a song is ending or has ended on one broadcast signal, and may then switch to a broadcast signal on which a song is beginning.

Figure 5C:
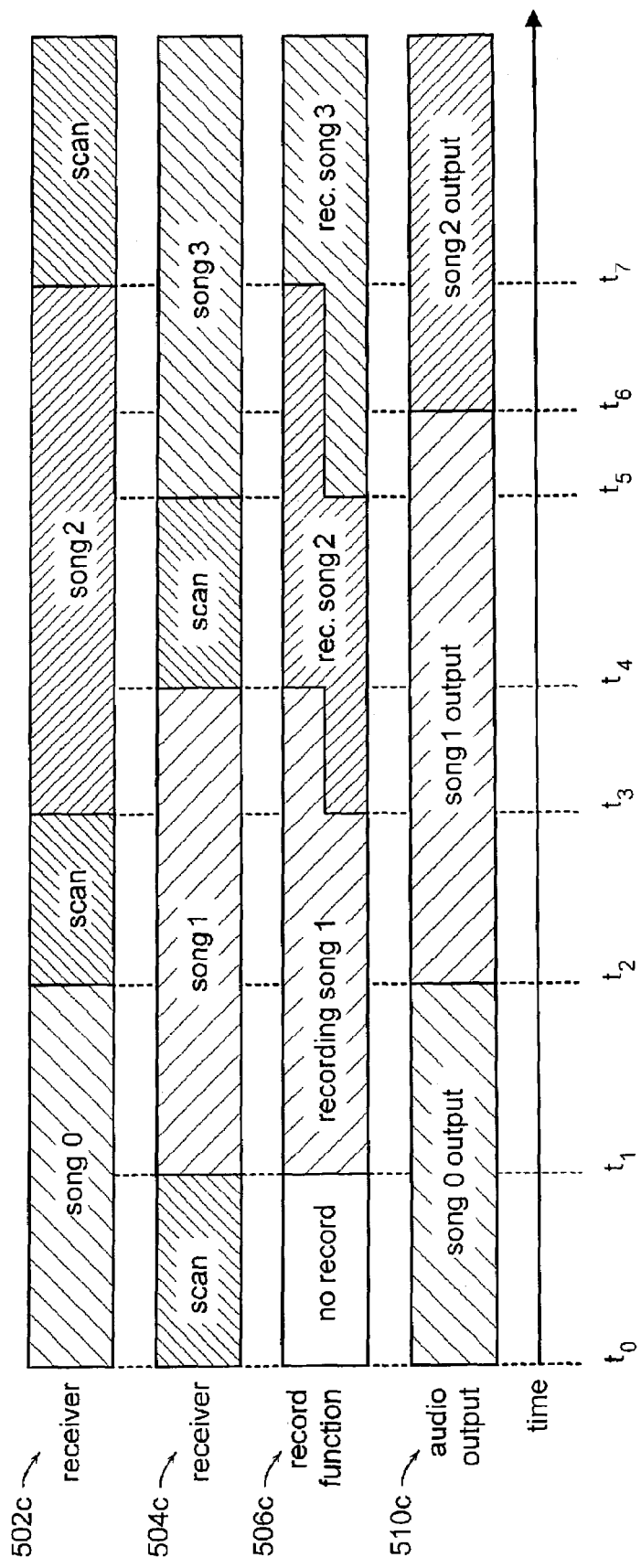
FIG. 5c depicts a further embodiment of a system permitting a system to eliminate program data undesired by a user from an audio playback in accordance with an embodiment of the invention.

FIG. 5c depicts a further embodiment of a system permitting "commercial skipping." FIG. 5c shows a system having two receivers 502c and 504c. At time $t_o$ the system is directed to permit commercial skipping, and receiver 502c may be tuned to a first broadcast signal and may operate as the foreground tuner (shown here receiving song 0 from $t_0$ until $t_2$), while receiver 504c may scan in the background.

At time $t_1$, the system may determine the beginning of song 1 on a background broadcast signal (by monitoring the supplemental data in accordance with the present invention). Receiver 504c may be tuned to the appropriate broadcast signal, the background scanning function of receiver 504c may be disabled, and an audio signal (song 1) from receiver 504c may be recorded 506c by the system, storing the song data in a memory device (analogous to mass storage device 104d).

At time $t_2$, the end of song 0 may be detected by the system (in accordance with the present invention). At this time, the system may cease audio output of the data received on receiver 502c and may begin audio output from song data (song 1) stored in memory. The system may begin playback of song 1 from memory while still recording the remainder of song 1 from receiver 504c. The playback and recording operations are thus offset in time by $t=t_2-t_1$. Also at time $t_2$, receiver 502c may be switched into background scanning mode, and the system may again search for the beginning of a song.

At time $t_3$, the system may identify the beginning of song 2 on a receivable broadcast signal. Receiver 502c may be tuned to the appropriate broadcast signal, its background scanning function may be disabled, and the system may begin recording song 2 into memory.

At time $t_4$, the end of song 1 (being received on receiver 504c) may be detected by the system. The system may then suspend recording the output of receiver 504c, and receiver 504c may be switched to background scanning mode. Thus, between times $t_3$ and $t_4$, the system may both record the remainder of song 1, simultaneously play back from memory the beginning of song 1 (with time offset $t_2-t_1$), and simultaneously record song 2 into memory. Thus, in this embodiment the system is capable of simultaneously recording two different audio streams while outputting to audio at least one of the streams.

At time $t_5$, the system may detect the beginning of song 3. Receiver 504c may be tuned to the appropriate frequency, background scanning on receiver 504c may be disabled, and the output of receiver 504c (song 3) may be recorded into memory simultaneously with the recording of the end of song 2.

At time $t_6$, playback of song 1 from memory may be completed, and the system may then begin playing back song 2 from memory. Between times $t_6$ and $t_7$, songs 2 and 3 may be recorded into memory while song 2 is played back from memory to speakers.

At time $t_7$, the end of song 2 may be detected by the system. Recording of song 2 may be stopped, and receiver 502c may be directed to scan in the background. Playback of song 2 and the recording of song 3 may continue until the playback of song 2 is completed.

In the embodiment described above, during the periods of time when two songs are being recorded simultaneously, neither of the receivers is operating in background scanning mode; there may thus be portions of time where the system is not updating its database of supplemental data. An alternative embodiment may provide a third receiver. In such an embodiment, background scanning may occur continuously while commercial free operation occurs. In such case, one receiver would always be available to perform background scanning.

Another embodiment of the present invention may permit a background search of detectable broadcast signals, for example, for an "artist", "title" or "genre". For example, a user may instruct the system to search for a song by The Rolling Stones. A background search for Rolling Stones songs may be permitted, as may be their recording to memory. Associated information, such as the "artist", "title", "genre", duration of the song and time of the recording information, may be also stored along with the recording to assist with future selection. Further control of the storage process may be permitted: if, for example, a recording of a selected song already existed on the media storage device, the user may be notified, or the recording of higher quality may be retained (or recorded). The quality of the recording may be inferred from the stored value of signal quality maintained in the background scanning database. Recording of the foreground broadcast signal is also permitted, such that a user may record, for example, music of interest, along with determined information such as "artist", "title", and "genre". In addition, a user may search recorded program data, for example, for an "artist", "title" or "genre".

Another embodiment of the present invention may permit archiving a time/date stamped recording of program data, for example, of recent weather or traffic bulletins. For example, clock/time information determined as a parameter of a broadcast stream may be stored in memory along with program data. Such weather or traffic report would later be available for replay by a user.

Figure 11:
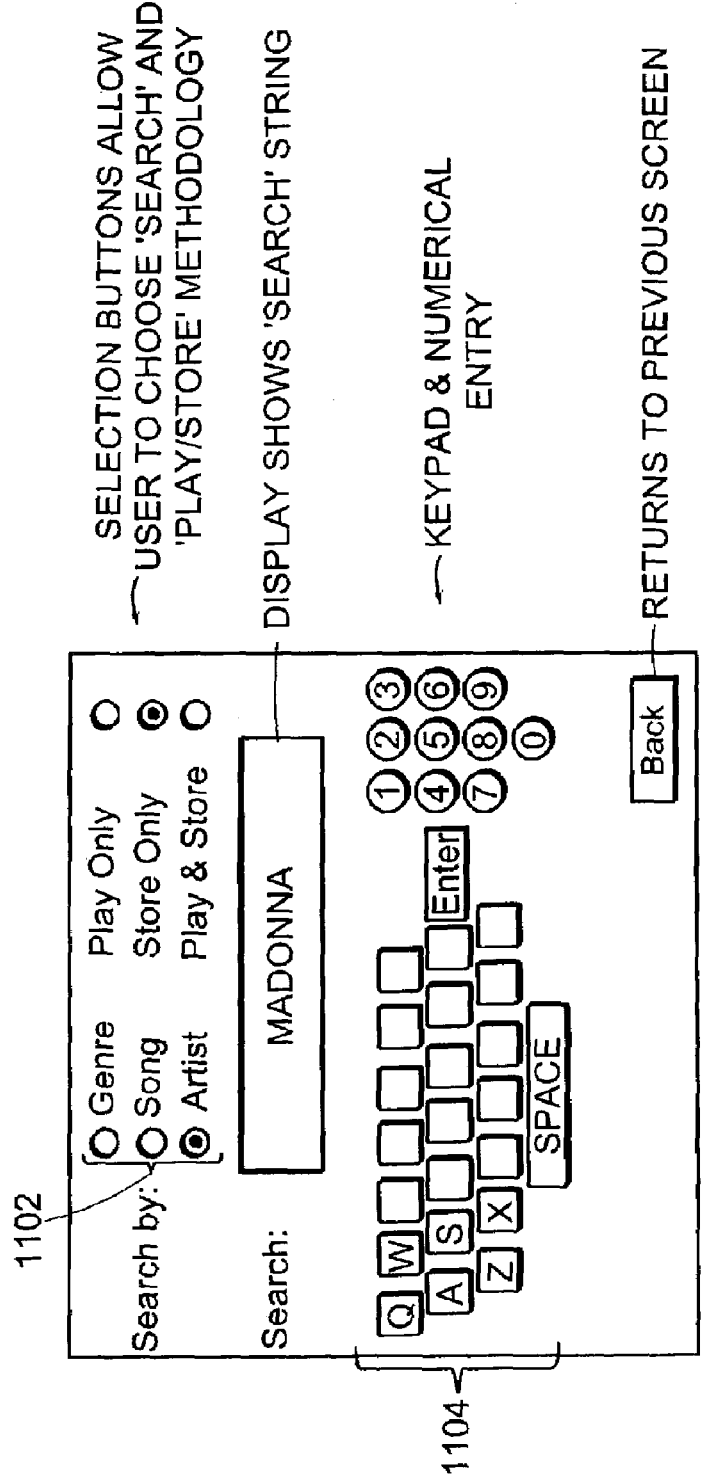

Another embodiment of the invention may permit a user to enter a direct request for an "artist" or "song title" and also provides for a "recall" of that prior requested "artist" or "song title" at some future distant time. For example, if the requested item is not found immediately, the request stays active so that at some future time when the requested item (song or artist, for example) becomes available, the system may process the request. Artist names or song titles may be selected through means including a keypad, a touch screen, a rotary push switch that selects characters and enters them upon depression, or by more sophisticated means such as voice recognition. FIG. 11 depicts one embodiment of a keypad entry means. Memory storage is also provided so that if this song became available in a week or two, it may be automatically played.

Figure 6:
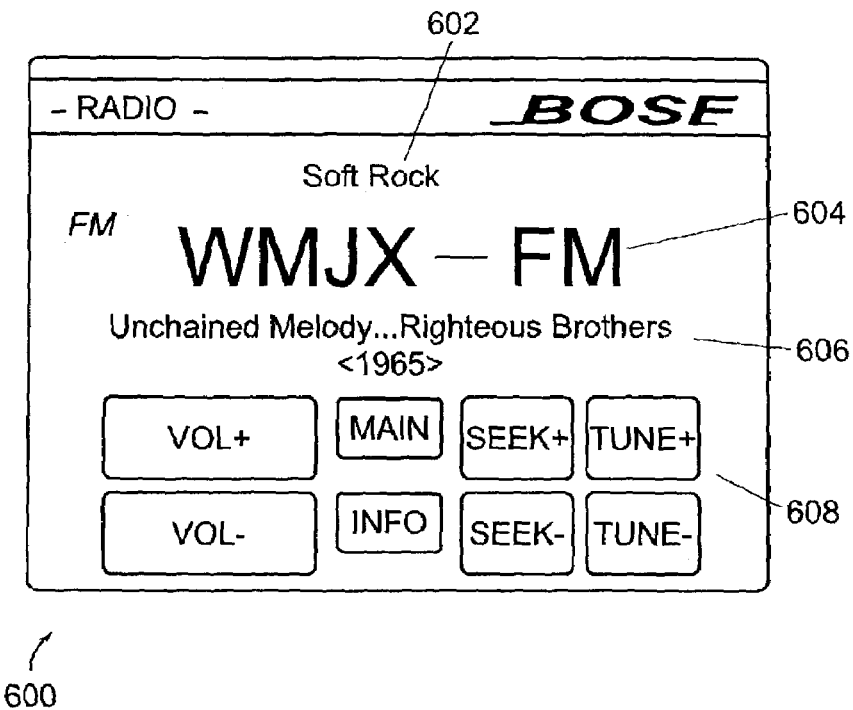
FIGS. 6 through 11a depict embodiments of a user interface that may be employed with the present invention.

FIGS. 6 through 11a depict embodiments of a user interface that may be employed with the present invention. FIG. 6 depicts a display 600 permitting showing of the current station name 604, which may also be, for example, a frequency or any other information which may identify a broadcast signal. Additional data determined from the broadcast signal may also be displayed, such as the genre of the current program data 602 or the title and artist of the current program 606. Virtual buttons 608 may also be provided to permit a user to make selections and affect various system functions.

Figure 6A:
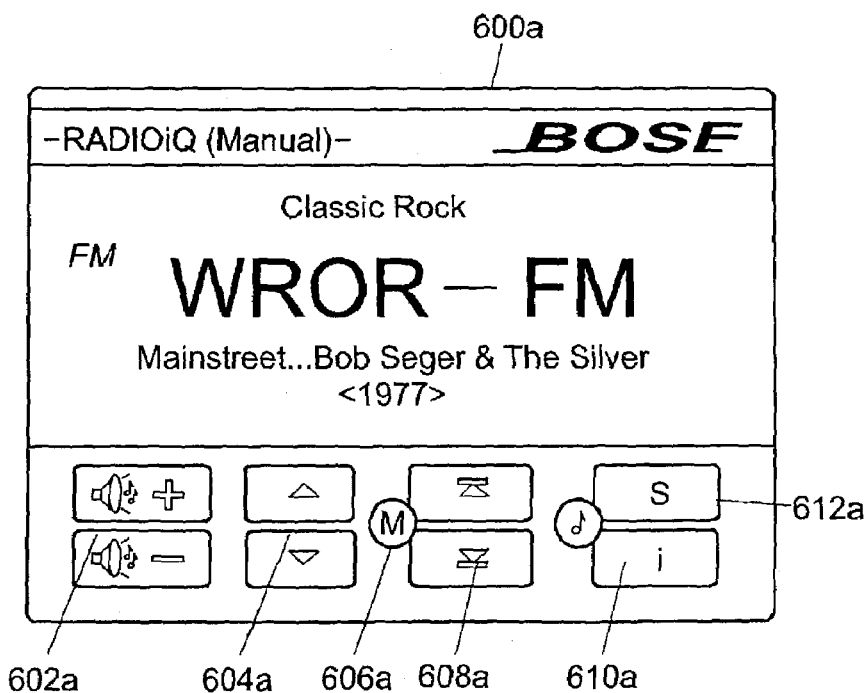
Figure 6B:
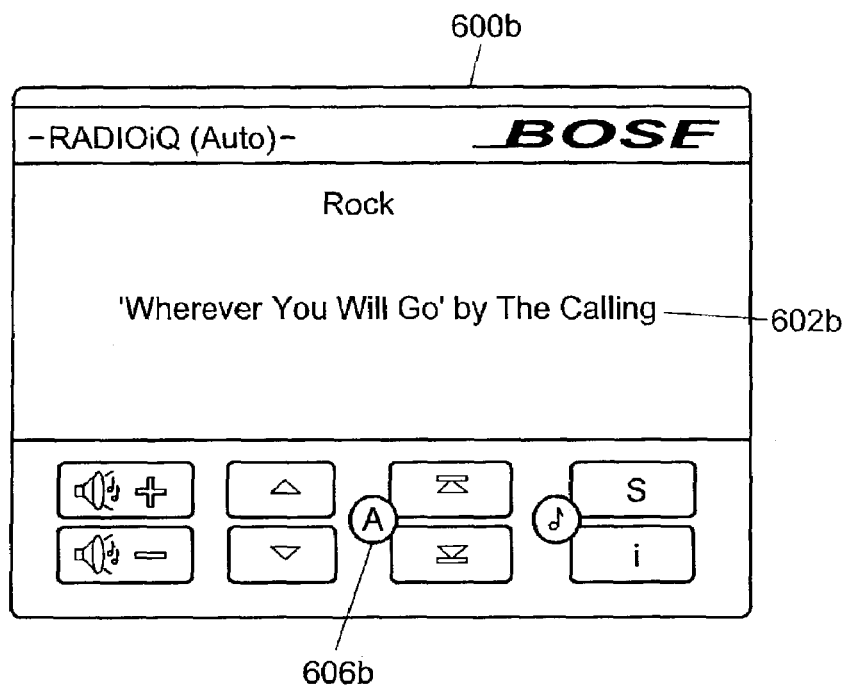

FIG. 6a depicts an alternate embodiment of FIG. 6. Display 600a may include virtual volume controls 602a, tuner controls 604a, seek controls 608a, information query 610a and source selection 612a. Indicator 606a shows that the system is in "manual mode", allowing user selection of broadcast signals. Indicator 606a may also indicate other modes of system function, for example, commercial skipping or "automatic mode." FIG. 6b depicts another alternate embodiment of FIG. 6. Display 600b may include similar controls as depicted in FIG. 6a; except however that indicator 606b indicates that the system is in "automatic mode," i.e. that a commercial skipping functionality is active. Moreover, broadcast signal information 602b is vastly simplified, e.g. only displaying title and artist, to make broadcast signal switching transparent to a user, to avoid distracting a vehicle operator, and for aesthetic purposes.

Figure 7:
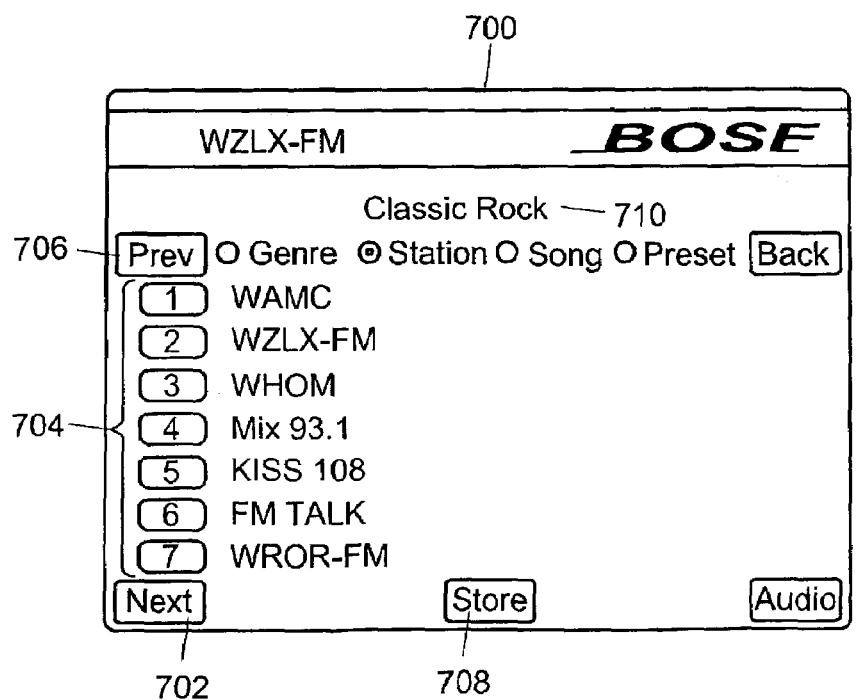

In FIG. 7, display 700 may permit the listing and selection of various broadcast signals by station. A sequential list of broadcast signals 704 may be provided, displaying station information acquired from supplemental data; if no supplemental data were available, other identifying information, such as a frequency, may be displayed. A user may scroll forward 702 or back 706 through a list of broadcast signals. A user may also select a store function 708 to permit recording of song data in accordance with the present invention. Display 700 shows the genre 710 of currently playing song data, but any information may be displayed therein, such as title, artist, or other identifying information.

Figure 8:
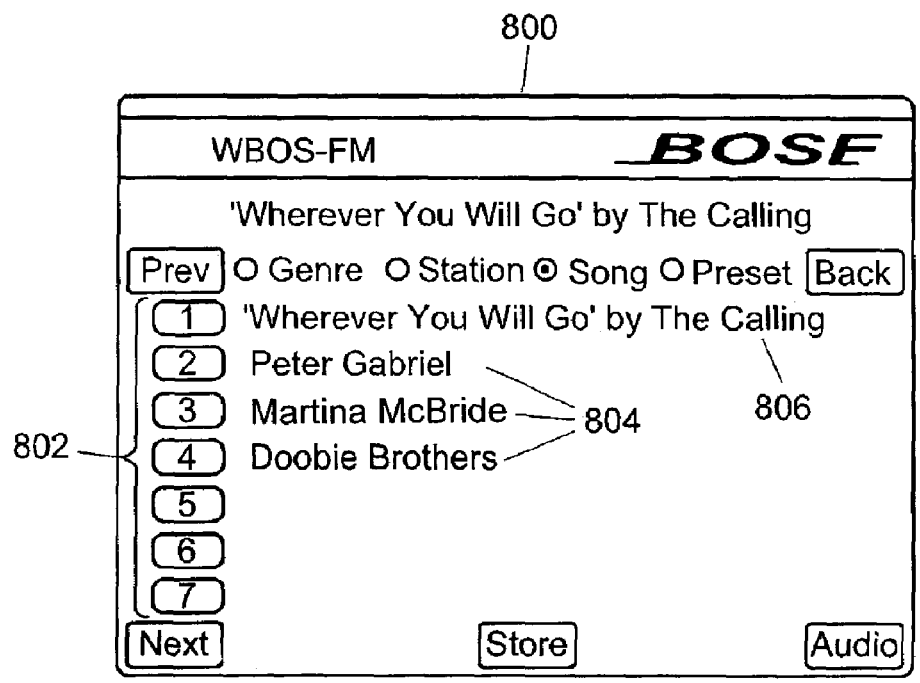

In FIG. 8, display 800 depicts a listing of broadcast signals by current song. In one embodiment of display 800, a listing including title and artist 806 may indicate that the song is currently playing, whereas a listing having only the artist 804 may indicate that the a song by the displayed artist will be soon available on that broadcast signal.

Figure 9:
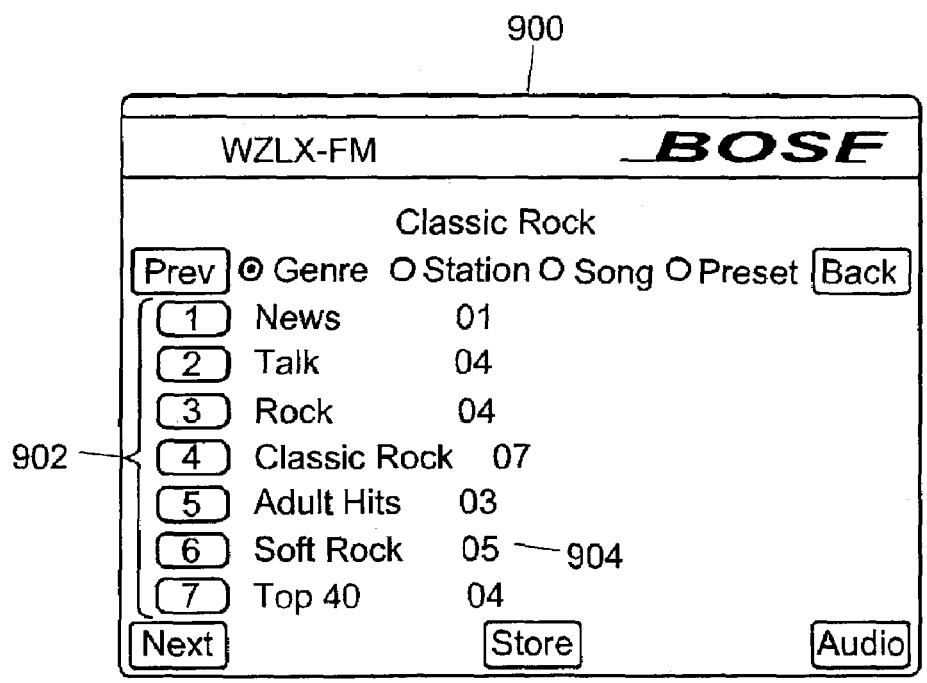

FIG. 9 shows display 900 depicting a listing of receivable broadcast signals by genre 902. A number following each listing 904 may indicate the number of broadcast signals available currently broadcasting a particular genre of music. Should a user select, e.g., choice 6, the user may be permitted to select from among the broadcast signals of the selected genre.

Figure 9A:
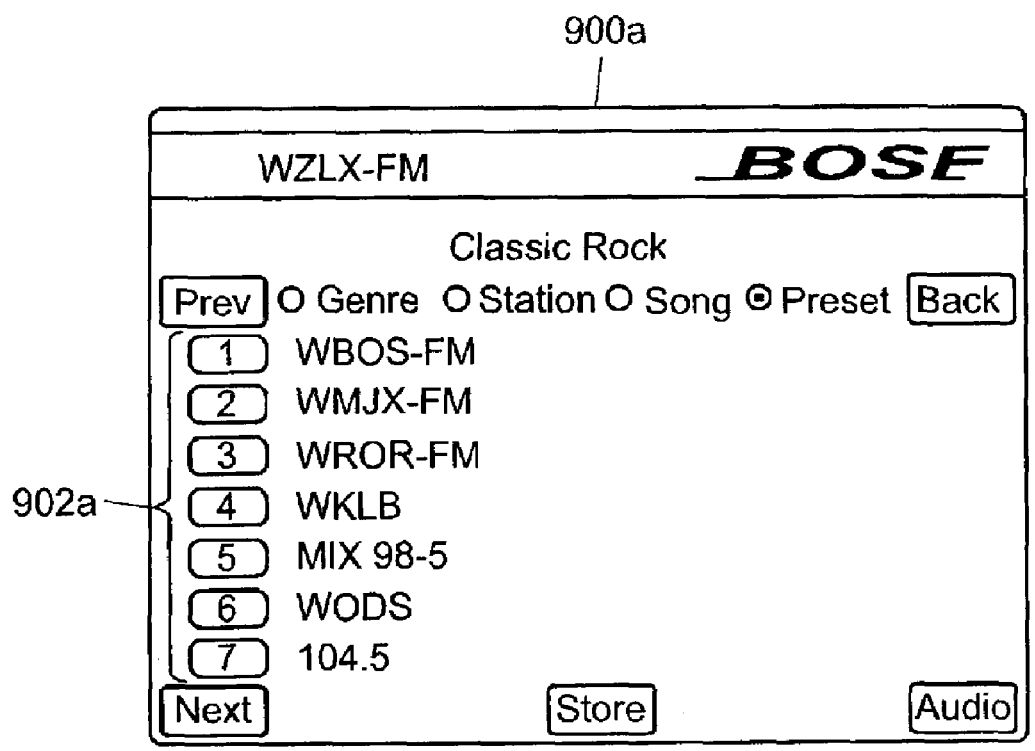

FIG. 9a depicts a display 900a showing a list of broadcast signals which have been preset by a user. Those selections may be changed as desired by a user. Other functions may be available to a user as described above.

Figure 10:
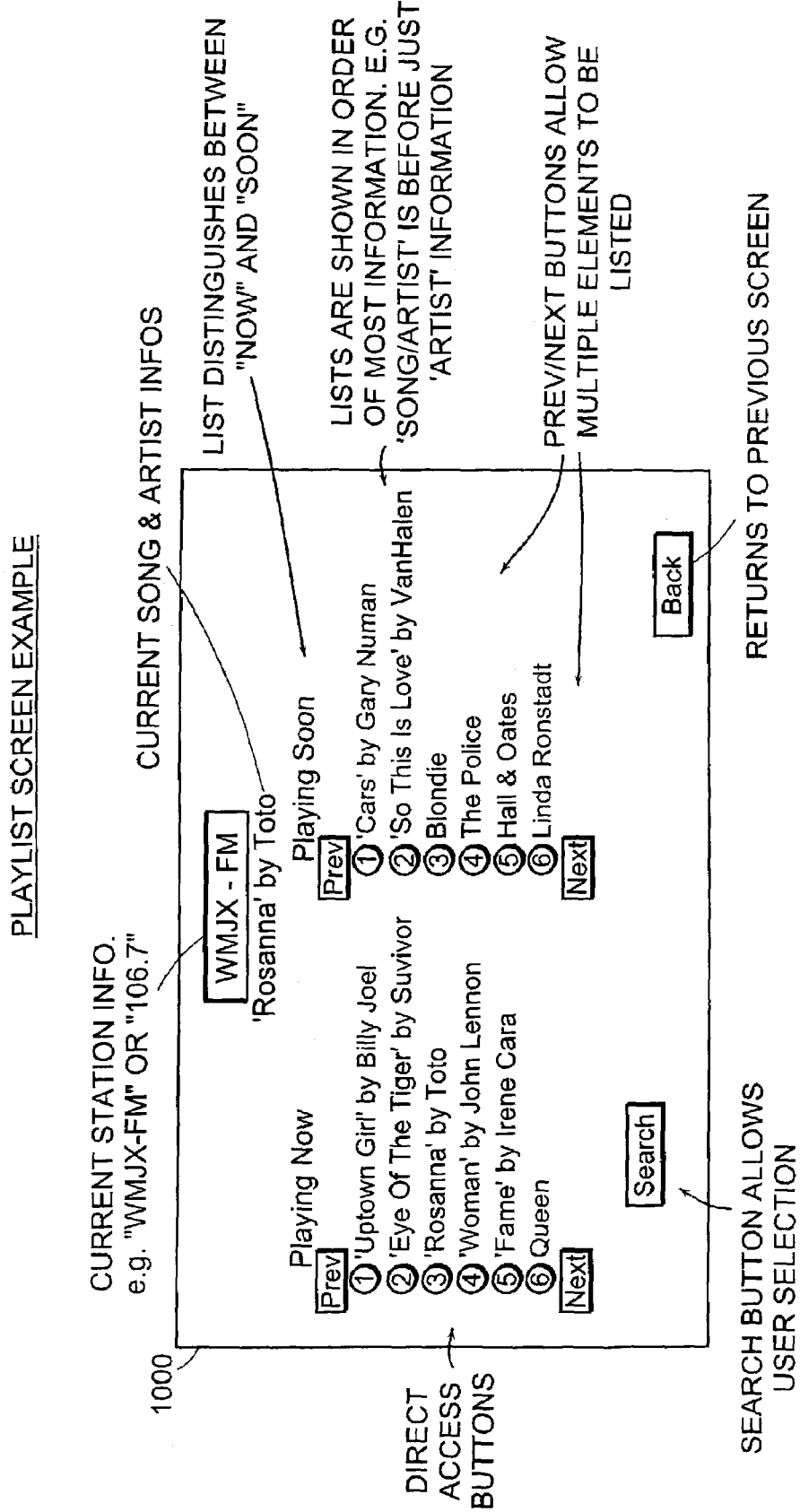
Figure 11A:
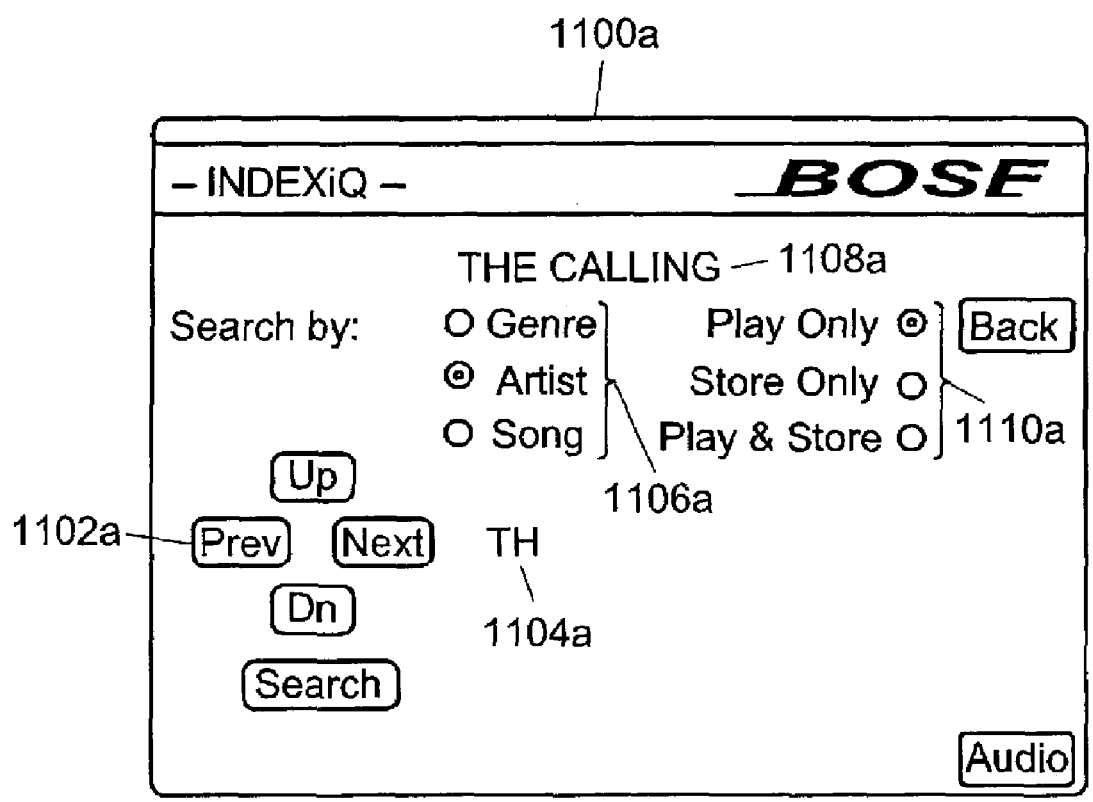

FIG. 10 depicts a display 1000 showing current and upcoming songs listed by title and artist. FIG. 11 shows a search function whereby a user may search for a keyword. The keyword search may also be made within a category, such as a genre, title or artist 1102. A search keyword may be entered, for example, by means of a keypad 1104, though any means of input maybe used to achieve the same functionality. FIG. 11a depicts an alternative embodiment to the search function illustrated in FIG. 11. Selection of an alphanumeric search string may be made by means of selectors 1102a, which may be displayed for the user 1104a. A user may search by category, e.g. genre, artist or song 1106a, which search results may be displayed 1108a. A user may also choose to play or store the song data associated with the search result 1110a.

The displays in FIGS. 6-11a may be used interchangeably or in any combination. It will also be readily evident to one of ordinary skill in the art that elements of the displays shown in FIGS. 6-11a may be combined into equivalent displays without loss of generality.

In addition, elements of the present invention requiring user input and attention may be disabled for safety, for example during driving (by means of, for example, sensing the state of the ignition/transmission interlock) to avoid potential distraction of driver attention. The elements that would be disabled would be those that required substantial attention on the part of the user in order to use, such as the entering in of song titles, artist names, or other information for search or store functions. Other features may be disabled to avoid distracting a driver. For example, if a user has instructed the system to "skip commercials," the current station or frequency display may change relatively rapidly as the system switches stations as often as after each song; in such case, the display screen may be Changed to only show "artist, song and genre" information and to eliminate the display of current station or frequency information.

The foregoing description illustrates only certain preferred embodiments, and one of ordinary skill in the art will recognize that the concepts embodied herein may be readily adapted without undue experimentation and may be embodied in other specific forms without departing from the essential characteristics hereof. Accordingly, the disclosure is intended to be merely illustrative and not limiting of the scope of the invention described in the following claims.

What is claimed is:

1. A method of parsing and characterizing text data from a broadcast signal, said broadcast signal having program data and supplemental data associated therewith, comprising the steps of:
   receiving a broadcast signal having supplemental broadcast data with associated text data;
   comparing said received text data to at least one known text string, to distinguish from said text data at least one recognized data string and at least one unrecognized data string, wherein said at least one recognized data string is a match to said at least one known text string;
   assigning a characterization to said at least one unrecognized data string to define at least one characterized data string,
   creating an association in a memory between said at least one characterized data string and said broadcast signal.
   wherein, in the step of comparing, said recognized data string is the text string "UP NEXT ON", "/", " . . . ", "(",")", "[", "]", "<", ">", "PLAYING SONG", "PLAYING ARTIST", "NOW PLAYING", "-", or "!".

2. A method of parsing and characterizing text data from a broadcast signal, said broadcast signal having program data and supplemental data associated therewith, comprising the steps of:
   receiving a broadcast signal having supplemental broadcast data with associated text data;
   comparing said received text data to at least one known text string, to distinguish from said text data at least one recognized data string and at least one unrecognized data string, wherein said at least one recognized data string is a match to said at least one known text string;
   assigning a characterization to said at least one unrecognized data string to define at least one characterized data string,
   creating an association in a memory between said at least one characterized data string and said broadcast signal,
   wherein, in the step of assigning, said characterization indicates the content of the program data, the identity of the broadcast station, or the duration of the program data.

3. The method of claim 2 wherein, in the step of assigning, said characterization is based on the relative position of said unrecognized data string to said recognized data string.

4. The method of claim 2 wherein, in the step of assigning, said characterization is based on said supplemental broadcast data.

5. The method of claim 2 wherein, in the step of creating, said association is between said at least one characterized data string and said program data.

6. The method of claim 2, further comprising the step of:
   formatting said at least one characterized data string in a manner consistent with said characterization.

7. The method of claim 2, further comprising the step of:
   displaying said at least one characterized data string in a manner consistent with said characterization.

8. The method of claim 7, further comprising the step of:
   permitting a user to select a broadcast signal based on at least one of: said at least one unrecognized data string, at least one formatted unrecognized data string, and said at least one characterized data string.

9. The method of claim 2, further comprising the step of:
   storing said at least one unrecognized data string and said characterization in a memory.

10. The method of claim 2, further comprising the step of:
   permitting a user to select a broadcast signal based on said characterization.

11. A method of providing for a user a stream of program data which is free of unwanted program data, comprising the steps of:
- receiving a first broadcast signal having first program data from a first data source; outputting said first program data for a user;
- during the outputting of said first program data, scanning a plurality of second data sources for second program data;
- selecting second program data from among said plurality of sources;
- determining a point in time when said first program data comprises unwanted program data; and
- without requiring input from said user, retrieving said selected second program data from a memory and outputting said selected second program data for said user at said point in time.

12. The method of claim 11 wherein, in the step of scanning, said plurality of second data sources further comprises at least two of: a second broadcast signal, a data storage device, a recordable data storage medium, a prerecorded data storage medium, a computer network, or a computer internetwork.

13. The method of claim 11 wherein, in the step of selecting, said second program data is data selected based on choices made by said user.

14. The method of claim 11 wherein, in the step of determining, said determining is based on one of: supplemental broadcast data associated with said first broadcast signal, text data associated with said first broadcast signal, program start and stop data, and determined average program data lengths.

15. The method of claim 11 wherein after the step of selecting the method further comprises:
- storing said second program data in a memory.

16. The method of claim 15 wherein, in the step of determining, said determining may occur before the step of storing is completed.

17. The method of claim 16 wherein, in the step of retrieving, said retrieving may follow the step of determining, before the step of storing is completed.

18. The method of claim 15, wherein the step of storing further comprises storing said second program data in a manner which permits output of said second program data before said storing is complete.

19. An apparatus comprising:
- a first receiver operable to receive a first broadcast signal having first program data; a processor configured to:
  - output said first program data;
  - during the outputting of said first program data, scanning a plurality of second data sources for second program data;
  - select second program data from among said plurality of sources;
  - determine a point in time when said first program data comprises unwanted program data; and
  - without requiring input from said user, retrieve said selected second program data from a memory and output said selected second program data at said point in time.

20. The apparatus of claim 19 further comprising said plurality of second data sources, said plurality of second data sources comprising at least two of:
- a second receiver, a data storage device, a recordable data storage medium, a prerecorded data storage medium, a computer network, or a computer internetwork.

21. The apparatus of claim 19 wherein said process is further configured to store said second program data in said memory after selecting said second program data.

22. The apparatus of claim 21 wherein said processor is configured to determine the point in time before completing storing said selected second program data.

23. The apparatus of claim 22 wherein said processor is configured to retrieve said selected second program data from said memory after said determining and before completing storing said selected second program data in said memory.

24. The apparatus of claim 21 wherein said processor is configured to store said selected second program data in said memory in a manner which permits output of said selected second program data before said storing is complete.

* * * * *